(12) United States Patent
Douki et al.

(10) Patent No.: US 6,482,568 B1
(45) Date of Patent: Nov. 19, 2002

(54) RADIATION-SENSITIVE RESIN COMPOSITION

(75) Inventors: Katsuji Douki, Ithaca, NY (US); Kiyoshi Murata, Mie (JP); Hiroyuki Ishii, Mie (JP); Toru Kajita, Mie (JP); Tsutomu Shimokawa, Mie (JP)

(73) Assignee: JSR Corporation, Tokyo (JP)

( * ) Notice: Subject to any disclaimer, the term of this patent is extended or adjusted under 35 U.S.C. 154(b) by 60 days.

(21) Appl. No.: 09/662,160

(22) Filed: Sep. 14, 2000

(30) Foreign Application Priority Data

Sep. 17, 1999 (JP) .......................................... 11-264110
Oct. 13, 1999 (JP) .......................................... 11-291291
Nov. 16, 1999 (JP) .......................................... 11-325222

(51) Int. Cl.$^7$ ............................................. G03F 7/004
(52) U.S. Cl. ..................... 430/270.1; 430/910; 430/905
(58) Field of Search .............................. 430/270.1, 905, 430/910

(56) References Cited

U.S. PATENT DOCUMENTS 6,280,898 B1 * 8/2001 Hasegawa et al. ........ 430/270.1
6,312,867 B1 * 11/2001 Kinsho et al. ............ 430/270.1

FOREIGN PATENT DOCUMENTS

| EP | 0 794 458 A2 | 9/1997 |
| EP | 0 836 119 A1 | 4/1998 |
| EP | 0 921 439 A1 | 6/1999 |
| EP | 0 930 541 A1 | 7/1999 |
| EP | 1 048 983 A1 | 11/2000 |
| JP | 11305444 A * | 11/1999 |

OTHER PUBLICATIONS

Partial machine translation of JP 11305444, detailed description and example.*

* cited by examiner

*Primary Examiner*—Rosemary Ashton
(74) *Attorney, Agent, or Firm*—Piper Rudnick LLP; Steven B. Kelber

(57) ABSTRACT

A radiation-sensitive resin composition comprising (A) a resin containing an acid-dissociable group which is insoluble or scarcely soluble in alkali and becomes alkali soluble when the acid-dissociable group dissociates, comprising the following recurring unit (I), recurring unit (II), and at least one of the recurring units (III-1) and (III-2), and (B) a photoacid generator.

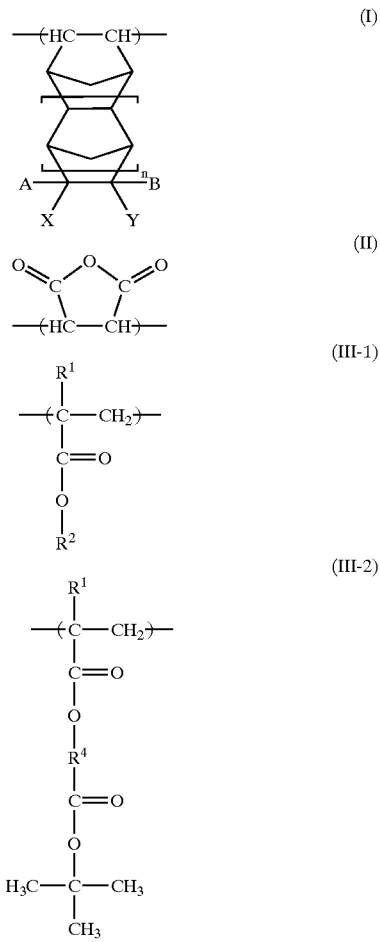

The radiation-sensitive resin composition is suitable for use as a chemically-amplified resist showing sensitivity to active radiation such as deep ultraviolet rays represented by a KrF excimer laser or ArF excimer laser, exhibiting superior dry etching resistance without being affected by types of etching gas, having high radiation transmittance, exhibiting excellent basic characteristics as a resist such as sensitivity, resolution, and pattern shape, possessing excellent storage stability as a composition, and exhibiting sufficient adhesion to substrates.

18 Claims, No Drawings

RADIATION-SENSITIVE RESIN COMPOSITION

BACKGROUND OF THE INVENTION

1. Field of the Invention

The present invention relates to a radiation-sensitive resin composition. More particularly, the present invention relates to a radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams.

2. Description of Background Art

In the field of microfabrication represented by fabrication of integrated circuit devices, a lithographic technology enabling microfabrication with a line width of 0.20 μm or less has been demanded in order to achieve higher integration.

A conventional lithographic process utilizes near ultraviolet rays such as i-line as radiation. It is known in the art that microfabrication with a line width of sub-quarter micron or less is very difficult using near ultraviolet rays.

Therefore, use of radiation with a shorter wavelength has been studied for enabling microfabrication with a line width of 0.20 μm or less. As radiation with a shorter wavelength, deep ultraviolet rays represented by a line spectrum of a mercury lamp and an excimer laser, X-rays, electron beams, and the like can be given. Of these, a KrF excimer laser (wavelength: 248 nm) and an ArF excimer laser (wavelength: 193 nm) have attracted attention.

As a radiation-sensitive resin composition applicable to the shorter wavelength radiation, a number of compositions utilizing a chemical amplification effect between a component having an acid-dissociable functional group and a photoacid generator which generates an acid upon irradiation (hereinafter called "exposure") has been proposed. Such a composition is hereinafter called a chemically-amplified radiation-sensitive composition.

As the chemically-amplified radiation-sensitive composition, Japanese Patent Publication No. 27660/1990 discloses a composition comprising a polymer containing a t-butyl ester group of carboxylic acid or a t-butyl carbonate group of phenol and a photoacid generator. This composition utilizes the effect of the polymer to release a t-butyl ester group or t-butyl carbonate group by the action of an acid generated upon exposure to form an acidic group such as a carboxylic group or a phenolic hydroxyl group, which renders an exposed area on a resist film readily soluble in an alkaline developer.

Most of conventional chemically-amplified radiation-sensitive compositions use a phenol resin as a base resin. Deep ultraviolet rays used as radiation for exposure are absorbed due to an aromatic ring in the resin and cannot sufficiently reach the lower layers of the resist film. Because of this, the dose of the radiation is greater in the upper layers and is smaller in the lower layers of the resist film. This causes a resist pattern to be thinner in the upper portion but to be thicker toward lower portion, thereby forming a trapezoid shape after development. No sufficient resolution can be obtained from such a resist film. Such a trapezoid shape formed after development cannot give a desired dimensional accuracy in the succeeding steps such as an etching step and an ion implantation step. In addition, if the configuration of the resist pattern is not rectangular on the upper portion, the resist disappears faster during dry etching, making it difficult to control etching conditions.

The shape of the resist pattern can be improved by increasing the radiation transmittance through the resist film. For example, (meth)acrylate resins represented by polymethylmethacrylate are desirable from the viewpoint of radiation transmittance due to superior transparency to deep ultraviolet rays. Japanese Patent Application Laid-open No. 226461/1992 proposes a chemically-amplified radiation-sensitive composition using a methacrylate resin. However, in spite of excellent micro-processing performance, this composition exhibits only poor dry etching resistance due to the absence of an aromatic ring, giving rise to difficulty to perform etching with high accuracy. This composition thus does not have both radiation transmittance and dry etching resistance at the same time.

A method of introducing an aliphatic ring into the resin component in the composition instead of an aromatic ring has been known as a means for improving dry etching resistance without impairing radiation transmittance of the resist made from a chemically-amplified radiation-sensitive composition. A chemically-amplified radiation-sensitive composition using a (meth)acrylate resin having an alicyclic ring is proposed in Japanese Patent Application Laid-open No. 234511/1995, for example.

This composition, however, comprises groups which are comparatively easily dissociated with conventional acids (for example, an acetal functional group such as a tetrahydropyranyl group) and groups which are comparatively difficult to be dissociated with acids (for example, a t-butyl functional group such as a t-butyl ester group, t-butyl carbonate group) as an acid-dissociable functional group as the resin component. The resin component possessing the former acid-dissociable functional group exhibits excellent basic characteristics as a resist such as superior sensitivity and excellent pattern shape, but has a problem of poor storage stability, whereas the resin component possessing the latter acid-dissociable functional group exhibits impaired resist characteristics, particularly in terms of sensitivity and pattern shape, in spite of excellent storage stability. In addition, inclusion of an alicyclic structure in the resin components increases hydrophobicity of the resin, resulting in poor adhesion to substrates.

Therefore, development of chemically-amplified radiation-sensitive compositions having superior transmittance of radiation represented by deep ultraviolet rays, excelling in dry etching resistance, sensitivity, resolution, and pattern shape, possessing superior storage stability, and exhibiting sufficient adhesion to substrates has been desired.

Accordingly, an object of the present invention is to provide a radiation-sensitive composition used as a chemically-amplified resist showing sensitivity to radiation such as deep ultraviolet rays represented by a KrF excimer laser and an ArF excimer laser, particularly exhibiting superior dry etching resistance without being affected by types of etching gases, having high radiation transmittance, exhibiting excellent basic characteristics as a resist such as sensitivity, resolution, and pattern shape, possessing excellent storage stability as a composition, and exhibiting sufficient adhesion to substrates.

SUMMARY OF THE INVENTION

According to the present invention, the above object can be achieved by a radiation-sensitive resin composition comprising:

(A) a resin containing an acid-dissociable group which is insoluble or scarcely soluble in alkali and becomes alkali soluble when the acid-dissociable group dissociates, the resin comprising the following recurring unit (I), recurring unit (II), and at least one of the recurring units (III-1) and (III-2);

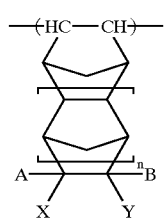

(I)

wherein A and B independently represent a hydrogen atom or a linear or branched alkyl group having 1–4 carbon atoms; X and Y independently represent a hydrogen atom, a monovalent oxygen-containing polar group, or a monovalent nitrogen-containing polar group, provided that at least one of X and Y represents a monovalent oxygen-containing polar group or a monovalent nitrogen-containing polar group, otherwise X and Y form a dicarboxylic anhydride group in combination; and n is an integer from 0 to 2;

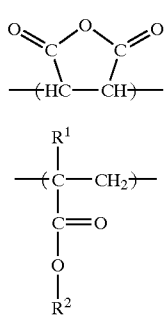

(II)

(III-1)

wherein $R^1$ represents a hydrogen atom or a methyl group; and R represents a group shown by the following formula (a);

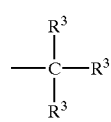

(a)

wherein $R^3$ s individually represent a monovalent alicyclic hydrocarbon group having 4–20 carbon atoms, a derivative thereof, or a linear or branched alkyl group having 1–4 carbon atoms, provided that at least one of $R^3$s is a monovalent alicyclic hydrocarbon group having 4–20 carbon atoms or a derivative thereof, or two of $R^3$ s form a divalent alicyclic hydrocarbon group having 4–20 carbon atoms or a derivative thereof in combination together with the carbon atom to which the two $R^3$s bond, with the remaining $R^3$ being a linear or branched alkyl group having 1–4 carbon atoms or a monovalent alicyclic hydrocarbon group having 4–20 carbon atoms or a derivative thereof;

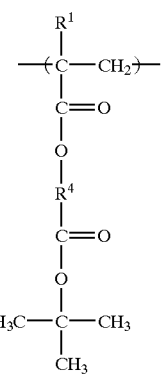

(III-2)

wherein $R^1$ is the same as defined above and $R^4$ represents a divalent hydrocarbon group having an alicyclic skeleton containing 3–15 carbon atoms; and (B) a photoacid generator.

According to the present invention, the above object can be also achieved by a radiation-sensitive resin composition comprising:

(A) a resin containing an acid-dissociable group which is insoluble or scarcely soluble in alkali and becomes alkali soluble when the acid-dissociable group dissociates, the resin comprising the following recurring unit (I-1), recurring unit (I-2), recurring unit (II), and at least one of the recurring units (III-1) and (III-2);

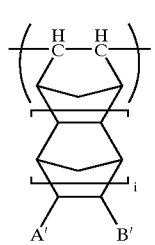

(I-1)

wherein A' and B' independently represent a hydrogen atom, a linear or branched alkyl group having 1–4 carbon atoms, or an acid-dissociable group having 20 or less carbon atoms which dissociates an acidic functional group in the presence of an acid, provided that at least one of A' or B' represent the acid-dissociable group, and i is an integer from 0 to 2;

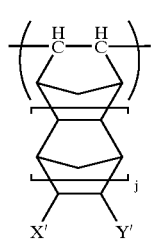

(I-2)

wherein X' and Y' independently represent a hydrogen atom, a linear or branched alkyl group having 1–4 carbon atoms, or a monovalent oxygen-containing polar group or a monovalent nitrogen-containing polar group, provided that at least one of X' and Y' represents the monovalent oxygen-containing polar group or monovalent nitrogen-containing polar group, and j is an integer from 0 to 2;

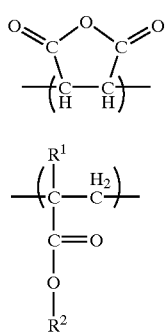

(II)

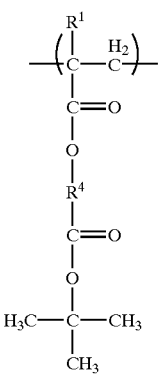

(III-1)

wherein $R^1$ and $R^2$ are the same as defined above;

(III-2)

wherein $R^1$ and $R^4$ are the same as defined above; and (B) a photoacid generator;

DETAILED DESCRIPTION OF THE INVENTION AND PREFERRED EMBODIMENT

The present invention will be described in detail.

Component (A)

The component (A) of the present invention is an acid-dissociable group-containing resin which is insoluble or scarcely soluble in alkali and becomes alkali soluble when the acid-dissociable group dissociates, comprising the recurring unit (I), recurring unit (II), and at least one of the recurring units (III-1) and (III-2) (hereinafter called "resin (A1)"), or an acid-dissociable group-containing resin which is insoluble or scarcely soluble in alkali and becomes alkali soluble when the acid-dissociable group dissociates, comprising the recurring unit (I-1), recurring unit (I-2), recurring unit (II), and at least one of the recurring units (III-1) and (III-2) (hereinafter called "resin (A2)").

The resin (A1) and resin (A2) provide the radiation-sensitive resin composition of the present invention with excellent dry etching resistance and superior radiation transmittance when the composition is used as a resist.

As examples of monomers which provide the recurring unit (I), norbornene derivatives shown by the following formula (3) (hereinafter called "norbornene derivatives (I)") can be given:

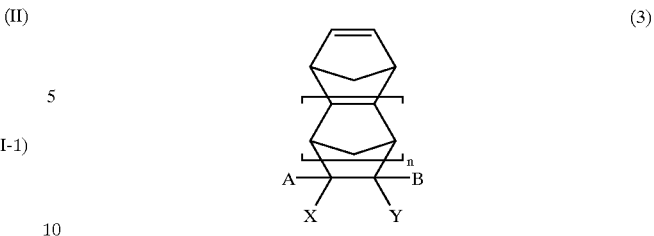

(3)

wherein A, B, X, Y, and n have the same meanings as defined for the formula (I).

As examples of a linear or branched alkyl group having 1–4 carbon atoms for A and B in the norbornene derivatives (I), a methyl group, ethyl group, n-propyl group, i-propyl group, n-butyl group, 2-methylpropyl group, 1-methylpropyl group, t-butyl group, and the like can be given. Of these, a methyl group and ethyl group are preferable.

Examples of an oxygen-containing polar group for X and Y in the norbornene derivatives (I) include: a hydroxyl group; carboxyl group; a linear, branched, or cyclic hydroxyalkyl group having 1–8 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, 4-hydroxybutyl group, 3-hydroxycyclopentyl group, and 4-hydroxycyclohexyl group; a linear, branched, or cyclic alkoxyl group having 1–8 carbon atoms such as a methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group; a linear, branched, or cyclic alkoxyalkyl group having 2–10 carbon atoms such as a methoxymethyl group, ethoxymethyl group, n-propoxymethyl group, i-propoxymethyl group, n-butoxymethyl group, t-butoxymethyl group, cyclopentyloxymethyl group, and cyclohexyloxymethyl group; a linear, branched, or cyclic alkoxyalkoxyl group having 2–10 carbon atoms such as a 1-methoxyethoxy group, 1-ethoxyethoxy group, 1-n-propoxyethoxy group, 1-n-butoxyethoxy group, 1-cyclopentyloxyethoxy group, 1-cyclohexyloxyethoxy group, 1-methoxypropoxy group, and 1-ethoxypropoxy group; a linear or branched alkoxycarbonyloxy group having 2–9 carbon atoms such as a methoxycarbonyloxy group, ethoxycarbonyloxy group, n-propoxycarbonyloxy group, i-propoxycarbonyloxy group, and n-butoxycarbonyloxy group; a linear, branched, or cyclic (1-alkoxyalkoxy)alkyl group having 3–11 carbon atoms such as a (1-methoxyethoxy)methyl group, (1-ethoxyethoxy)methyl group, (1-n-propoxyethoxy)methyl group, (1-n-butoxyethoxy)methyl group, (1-cyclopentyloxyethoxy)methyl group, (1-cyclohexyloxyethoxy)methyl group, (1-methoxypropoxy)methyl group, and (1-ethoxypropoxy)methyl group; a linear or branched alkoxycarbonyloxyalkyl group having 3–10 carbon atoms such as a methoxycarbonyloxymethyl group, ethoxycarbonyloxymethyl group, n-propoxycarbonyloxymethyl group, i-propoxycarbonyloxymethyl group, and n-butoxycarbonyloxymethyl group; a tetrahydrofuranyloxy group, tetrahydropyranyloxy group, tetrahydrofuranyloxymethyl group, tetrahydropyranyloxymethyl group; and the like.

Examples of a nitrogen-containing polar group for X and Y in the norbornene derivatives (I) include a cyano group;

a cyanoalkyl group having 2–9 carbon atoms such as a cyanomethyl group, 1-cyanoethyl group, 2-cyanoethyl group, 1-cyanopropyl group, 2-cyanopropyl group, 3-cyanopropyl group, 1-cyanobutyl group, 2-cyanobutyl group, 3-cyanobutyl group, and 4-cyanobutyl group; and the like.

Examples of the norbornene derivatives (I) include: bicyclo[2.2.1]hept-2-ene derivatives such as
5-hydroxybicyclo[2.2.1]hept-2-ene,
5-carboxybicyclo[2.2.1]hept-2-ene,
5-hydroxymethylbicyclo[2.2.1]hept-2-ene,
5-(2'-hydroxyethyl)bicyclo[2.2.1]hept-2-ene,
5-methoxybicyclo[2.2.1]hept-2-ene,
5-ethoxybicyclo[2.2.1]hept-2-ene,
5-(1'-methoxyethoxy)bicyclo[2.2.1]hept-2-ene,
5-(1'-ethoxyethoxy)bicyclo[2.2.1]hept-2-ene,
5-(1'-n-propoxyethoxy)bicyclo[2.2.1]hept-2-ene,
5-(1'-n-butoxyethoxy)bicyclo[2.2.1]hept-2-ene,
5-(1'-cyclohexyloxyethoxy)bicyclo[2.2.1]hept-2-ene,
5-methoxycarbonyloxybicyclo[2.2.1]hept-2-ene,
5-ethoxycarbonyloxybicyclo[2.2.1]hept-2-ene,
5-n-propoxycarbonyloxybicyclo[2.2.1]hept-2-ene,
5-n-butoxycarbonyloxybicyclo[2.2.1]hept-2-ene,
5-(1'-methoxyethoxy)methylbicyclo[2.2.1]hept-2-ene,
5-(1'-ethoxyethoxy)methylbicyclo[2.2.1]hept-2-ene,
5-(1'-n-propoxyethoxy)methylbicyclo[2.2.1]hept-2-ene,
5-(1'-n-butoxyethoxy)methylbicyclo[2.2.1]hept-2-ene,
5-(1'-cyclohexyloxyethoxy)methylbicyclo[2.2.1]hept-2-ene,
5-methoxycarbonyloxymethylbicyclo[2.2.1]hept-2-ene,
5-ethoxycarbonyloxymethylbicyclo[2.2.1]hept-2-ene,
5-n-propoxycarbonyloxymethylbicyclo.[2.2.1hept-2-ene,
5-n-butoxycarbonyloxymethylbicyclo[2.2.1]hept-2-ene,
5-tetrahydrofuranyloxybicyclo[2.2.1]hept-2-ene,
5-tetrahydropyranyloxybicyclo[2.2.1]hept-2-ene,
5-tetrahydrofuranyloxymethylbicyclo[2.2.1]hept-2-ene,
5-tetrahydropyranyloxymethylbicyclo[2.2.1]hept-2-ene,
5,6-dihydroxybicyclo[2.2.1]hept-2-ene,
5,6-dicarboxybicyclo[2.2.1]hept-2-ene,
5,6-di(hydroxymethyl)bicyclo[2.2.1]hept-2-ene,
5,6-di(2'-hydroxyethyl)bicyclo[2.2.1]hept-2-ene,
5,6-dimethoxybicyclo[2.2.1]hept-2-ene,
5,6-diethoxybicyclo[2.2.1]hept-2-ene,
5,6-di(1'-methoxyethoxy)bicyclo[2.2.1]hept-2-ene,
5,6-di(1'-ethoxyethoxy)bicyclo[2.2.1]hept-2-ene,
5,6-di(1'-n-propoxyethoxy)bicyclo[2.2.1]hept-2-ene,
5,6-di(1'-n-butoxyethoxy)bicyclo[2.2.1]hept-2-ene,
5,6-di(1'-cyclohexyloxyethoxy)bicyclo[2.2.1]hept-2-ene,
5,6-dimethoxycarbonyloxybicyclo[2.2.1]hept-2-ene,
5,6-diethoxycarbonyloxybicyclo[2.2.1]hept-2-ene,
5, 6-di-n-propoxycarbonyloxybicyclo[2.2.1]hept-2-ene,
5,6-di-n-butoxycarbonyloxybicyclo[2.2.1]hept-2-ene,
5,6-di[(1'-methoxyethoxy)methylbicyclo[2.2.1]hept-2-ene,
5 6-di[(1'-ethoxyethoxy)methyl]bicyclo[2.2.1]hept-2-ene,
5,6-di[(1'-n- propoxyethoxy)methyl]bicyclo[2.2.1]hept-2-ene,
5,6-di[(1'-n-butoxyethoxy)methyl]bicyclo[2.2.1]hept-2-ene,
5,6-di[(1'-cyclohexyloxyethoxy)methyl]bicyclo[2.2.1]hept-2-ene,
5,6-di(methoxycarbonyloxymethyl)bicyclo[2.2.1]hept-2-ene,
5,6-di(ethoxycarbonyloxymethyl)bicyclo[2.2.1]hept-2-ene,
5,6-di (n-propoxycarbonyloxymethyl) bicyclo [2.2.1] hept-2-ene,
5,6-di(n-butoxycarbonyloxymethyl)bicyclo[2.2.1]hept-2-ene,
5,6-di(tetrahydrofuranyloxy) bicyclo[2.2.1]hept-2-ene,
5,6-di(tetrahydropyranyloxy) bicyclo[2.2.1]hept-2-ene,
5,6-di(tetrahydrofuranyloxymethyl)bicyclo[2.2.1]hept-2-ene,
5,6-di(tetrahydropyranyloxymethyl)bicyclo[2.2.1]hept-2-ene,
5-hydroxy-5-methylbicyclo[2.2.1]hept-2-ene,
5-hydroxy-5-ethylbicyclo[2.2.1]hept-2-ene,
5-carboxy-5-methylbicyclo[2.2.1]hept-2-ene,
5-carboxy-5-ethylbicyclo[2.2.1]hept-2-ene,
5-hydroxymethyl-5-methylbicyclo[2.2.1]hept-2-ene,
5-hydroxymethyl-5-ethylbicyclo[2.2.1]hept-2-ene,
5-(2'-hydroxyethyl)-5-methylbicyclo[2.2.1]hept-2-ene,
5-(2'-hydroxyethyl)-5-ethylbicyclo[2.2.1]hept-2-ene,
5-methoxy-5-methylbicyclo[2.2.1]hept-2-ene,
5-methoxy-5-ethylbicyclo[2.2.1]hept-2-ene,
5-ethoxy-5-methylbicyclo[2.2.1]hept-2-ene,
5-ethoxy-5-ethylbicyclo[2.2.1]hept-2-ene,
5-(1'-methoxyethoxy)-5-methylbicyclo[2.2.1]hept-2-ene,
5-(1'-ethoxyethoxy)-5-methylbicyclo[2.2.1]hept-2-ene,
5-(1'-n-propoxyethoxy)-5-methylbicyclo[2.2.1]hept-2-ene,
5-(1'-n-butoxyethoxy)-5-methylbicyclo[2.2.1]hept-2-ene,
5-(1'-cyclohexyloxyethoxy)-5-methylbicyclo[2.2.1]hept-2-ene,
5-methoxycarbonyloxy-5-methylbicyclo [2.2.1] hept-2-ene,
5-ethoxycarbonyloxy-5-methylbicyclo [2.2.1] hept-2-ene,
5-n-propoxycarbonyloxy-5-methylbicyclo [2.2.1] hept-2-ene,
5-n-butoxycarbonyloxy-5-methylbicyclo [2.2.1] hept-2-ene,
5-(1'-methoxyethoxy) methyl-5-methylbicyclo [2.2.1] hept-2-ene,
5-(1'-ethoxyethoxy)methyl-5-methylbicyclo[2.2.1]hept-2-ene,
5- (1'-n-propoxyethoxy)methyl-5-methylbicyclo[2.2.1]hept-2-ene,
5-(1'-n-butoxyethoxy)methyl-5-methylbicyclo[2.2.1]hept-2-ene,
5-(1'-cyclohexyloxyethoxy)methyl-5-methylbicyclo[2.2.1] hept-2-ene,
5-methoxycarbonyloxymethyl-5-methylbicyclo[2.2.1]hept-2-ene
5-ethoxycarbonyloxymethyl-5-methylbicyclo[2.2.1]hept-2-ene,
5-n-propoxycarbonyloxymethyl-5-methylbicyclo[2.2.1] hept-2-ene,
5-n-butoxycarbonyloxymethyl-5-methylbicyclo[2.2.1]hept-2-ene,
5-tetrahydrofuranyloxy-5-methylbicyclo[2.2.1]hept-2-ene,
5-tetrahydropyranyloxy-5-methylbicyclo[2.2.1]hept-2-ene,
5-tetrahydrofuranyloxymethyl-5-methylbicyclo[2.2.]hept-2-ene,
5-tetrahydropyranyloxymethyl-5-methylbicyclo[2.2.1]hept-2-ene,
5-hydroxy-6-methylbicyclo[2.2.1]hept-2-ene,
5-hydroxy-6-ethylbicyclo[2.2.1]hept-2-ene,
5-carboxy-6-methylbicyclo[2.2.1]hept-2-ene,
5-carboxy-6-ethylbicyclo[2.2.1]hept-2-ene,
5-hydroxymethyl-6-methylbicyclo[2.2.1]hept-2-ene,
5-hydroxymethyl-6-ethylbicyclo[2.2.1]hept-2-ene,
5-(2'-hydroxyethyl)-6-methylbicyclo [2.2.1]hept-2-ene,
5-(2'-hydroxyethyl)-6-ethylbicyclo[2.2.1]hept-2-ene,
5-methoxy-6-methylbicyclo [2.2.1l]hept-2-ene,
5-methoxy-6-ethylbicyclo[2.2.1]hept-2-ene,
5-ethoxy-6-methylbicyclo[2.2.1]hept-2-ene,
5-ethoxy-6-ethylbicyclo[2.2.1]hept-2-ene,
5-cyano bicyclo[2. 2.1]hept-2- ene,
5-cyanomethylbicyclo[2.2.1]hept-2-ene,
5-(2'-cyanoethyl)bicyclo[2.2.1]hept-2-ene, 5,6-dicyanobicyclo[2.2.1]hept-2-ene,
5,6-di(cyanomethyl)bicyclo[2.2.1]hept-2-ene,
5,6-di(2'-cyanoethyl)bicyclo[2.2.1]hept-2-ene,
5-cyano-5-methylbicyclo[2.2.1]hept-2-ene,
5-cyano-5-ethylbicyclo[2.2.1]hept-2-ene,
5-cyanomethyl-5-methylbicyclo[2.2.1]hept-2-ene,
5-cyanomethyl-5-ethylbicyclo[2.2.1]hept-2-ene,
5-(2'-cyanoethyl)-5-methylbicyclo[2.2.1]hept-2-ene,
5-(2'-cyanoethyl)-5-ethylbicyclo[2.2.1]hept-2-ene,
5-cyano-6-methylbicyclo[2.2.1]hept-2-ene,
5-cyano-6-ethylbicyclo[2.2.1]hept-2-ene,
5-cyanomethyl-6-methylbicyclo[2.2.1]hept-2-ene,
5-cyanomethyl-6-ethylbicyclo[2.2.1]hept-2-ene,
5-(2'-cyanoethyl)-6-methylbicyclo[2.2.1]hept-2-ene,
5-(2'-cyanoethyl)-6-ethylbicyclo[2.2.1]hept-2-ene, and
5,6-dicarboxybicyclo[2.2.1]hept-2-ene anhydride (hymic anhydride);
tetracyclo[4.4.0.1$^{2,5}$.1$^{7,10}$]dodec-3-ene derivatives such as
8-hydroxytetracyclo[4.4.0.1$^{2,5}$.1$^{7,10}$]dodec-3-ene,
8-carboxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-(2'-hydroxyethyl)tetracyclo[4.4.0.1$^{2,5}$.1$^{7,10}$]dodec-3-ene,
8-methoxytetracyclo[4.4.0.1$^{2,5}$.1$^{7,10}$]dodec-3-ene,
8-ethoxytetracyclo[4.4.0.1$^{2,5}$.1$^{7,10}$]dodec-3-ene,
8-(1'-methoxyethoxy)tetracyclo[4.4.0.1$^{2,5}$.1$^{7,10}$]dodec-3-ene,
8-(1'-ethoxyethoxy)tetracyclo[4.4.0.1$^{2,5}$.1$^{7,10}$]dodec-3-ene,
8-(1'-n-propoxyethoxy)tetracyclo[4.4.0.1$^{2,5}$.1$^{7,10}$]dodec-3-ene,
8-(1'-n-butoxyethoxy)tetracyclo[4.4.0.1$^{2,5}$.1$^{7,10}$]dodec-3-ene,
8(1'-cyclohexyloxyethoxy) tetracyclo [4.4.0.1$^{2,5}$.1$^{7,10}$]dodec-3-ene,
8-methoxycarbonyloxytetracyclo[4.4.0.1$^{2,5}$.1$^{7,10}$]dodec-3-ene,
8-ethoxycarbonyloxytetracyclo[4.4.0.1$^{2,5}$.1$^{7,10}$]dodec-3-ene,
8-n-propoxycarbonyloxytetracyclo[4.4.0.1$^{2,5}$.1$^{7,10}$]dodec-3-ene,
8-n-butoxycarbonyloxytetracyclo[4.4.0.1$^{2,5}$.1$^{7,10}$]dodec-3-ene,
8-(1'-methoxyethoxy)methyltetracyclo[4.4.0.1$^{2,5}$.1$^{7,10}$]dodec-3-ene,
8-(1'-ethoxyethoxy)methyltetracyclo[4.4.0.1$^{2,5}$.1$^{7,10}$]dodec-3-ene, 8-(1'-n-propoxyethoxy)methyltetracyclo[4.4.0.1$^{2,5}$.1$^{7,10}$]dodec-3-ene,
8-(1'-n-butoxyethoxy)methyltetracyclo[4.4.0.1$^{2,5}$.1$^{7,10}$]dodec-3-ene,
8-(1'-cyclohexyloxyethoxy)methyltetracyclo[4.4.0.1$^{2,5}$.1$^{7,10}$]dodec-3-ene,
8-methoxycarbonyloxymethyltetracyclo[4.4.0.1$^{2,5}$.1$^{7,10}$]dodec-3-ene,
8-ethoxycarbonyloxymethyltetracyclo[4.4.0.1$^{2,5}$.1$^{7,10}$]dodec-3-ene,
8-n-propoxycarbonyloxymethyltetracyclo[4.4.0.1$^{2,5}$.1$^{7,10}$]dodec-3-ene,
8-n-butoxycarbonyloxymethyltetracyclo[4.4.0.1$^{2,5}$.1$^{7,10}$]dodec-3-ene,
8-tetrahydrofuranyloxytetracyclo[4.4.0.1$^{2,5}$.1$^{7,10}$]dodec-3-ene,
8-tetrahydropyranyloxytetracyclo[4.4.0.1$^{2,5}$.1$^{7,10}$]dodec-3-ene,
8-tetrahydrofuranyloxymethyltetracyclo[4.4.0.1$^{2,5}$.1$^{7,10}$]dodec-3-ene,
8-tetrahydropyranyloxymethyltetracyclo[4.4.0.1$^{2,5}$.1$^{7,10}$]dodec-3-ene,
8,9-dihydroxytetracyclo[4.4.0.1$^{2,5}$.1$^{7,10}$]dodec-3-ene,
8,9-dicarboxytetracyclo[4.4.0.1$^{2,5}$.1$^{7,10}$]dodec-3-ene,
8,9-di(hydroxymethyl)tetracyclo[4.4.0.1$^{2,5}$.1$^{7,10}$]dodec-3-ene,
8,9-di(2'-hydroxyethyl)tetracyclo[4.4.0.1$^{2,5}$.1$^{7,10}$]dodec-3-ene,
8,9-dimethoxytetracyclo[4.4.0.1$^{2,5}$.1$^{7,10}$]dodec-3-ene,
8,9-diethoxytetracyclo[4.4.0.1$^{2,5}$.1$^{7,10}$]dodec-3-ene,
8,9-di(1'-methoxyethoxy)tetracyclo[4.4.0.1$^{2,5}$.1$^{7,10}$]dodec-3-ene,
8,9-di(1'-ethoxycarbonyloxy)tetracyclo [4.4.0.1$^{2,5}$.1$^{7,10}$]dodec-3-ene,
8,9-di(1'-n-propoxyethoxy)tetracyclo[4.4.0.1$^{2,5}$.1$^{7,10}$]dodec-3-ene,
8,9-di(1'-n-butoxyethoxy)tetracyclo[4.4.0.1$^{2,5}$.1$^{7,10}$]dodec-3-ene,
8,9-di(1'-cyclohexyloxyethoxy)tetracyclo[4.4.0.1$^{2,5}$.1$^{7,10}$]dodec-3-ene,
8,9-dimethoxycarbonyloxytetracyclo[4.4.0.1$^{2,5}$.1$^{7,10}$]dodec-3-ene,
8,9-diethoxycarbonyloxytetracyclo[4.4.0.1$^{2,5}$.1$^{7,10}$]dodec-3-ene,
8,9-di-n-propoxycarbonyloxytetracyclo[4.4.0.1$^{2,5}$.1$^{7,10}$]dodec-3-ene,
8,9-di-n-butoxycarbonyloxytetracyclo[4.4.0.1$^{2,5}$.1$^{7,10}$]dodec-3-ene,
8,9-di[(1'-methoxyethoxy)methyl]tetracyclo[4.4.0.1$^{2,5}$.1$^{7,10}$]dodec-3-ene,
8,9-di[(1'-ethoxyethoxy)methyl]tetracyclo[4.4.0.1$^{2,5}$.1$^{7,10}$]dodec-3-ene,
8,9-di[(1'-n-propoxyethoxy)methyl]tetracyclo[4.4.0.1$^{2,5}$.1$^{7,10}$]dodec-3-ene,
8,9-di[(1'-n-butoxyethoxy)methyl]tetracyclo[4.4.0.1$^{2,5}$.1$^{7,10}$]dodec-3-ene,
8,9-di[(1'-cyclohexyloxyethoxy)methyl]tetracyclo[4.4.0.1$^{2,5}$.1$^{7,10}$]dodec-3-ene,
8,9-di(methoxycarbonyloxymethyl)tetracyclo[4.4.0.1$^{2,5}$.1$^{7,10}$]dodec-3-ene,
8,9-di(ethoxycarbonyloxymethyl)tetracyclo[4.4.0.1$^{2,5}$.1$^{7,10}$]dodec-3-ene,
8,9-di(n-propoxycarbonyloxymethyl)tetracyclo[4.4.0.1$^{2,5}$.1$^{7,10}$]dodec-3-ene,
8,9-di(n-butoxycarbonyloxymethyl)tetracyclo[4.4.0.1$^{2,5}$.1$^{7,10}$]dodec-3-ene,
8,9-di(tetrahydrofuranyloxy)tetracyclo[4.4.0.1$^{2,5}$.1$^{7,10}$]dodec-3-ene,
8,9-di(tetrahydropyranyloxy)tetracyclo[4.4.0.1$^{2,5}$.1$^{7,10}$]dodec-3-ene,
8,9-di(tetrahydrofuranyloxymethyl)tetracyclo[4.4.0.1$^{2,5}$.1$^{7,10}$]dodec-3-ene,
8,9-di(tetrahydropyranyloxymethyl)tetracyclo[4.4.0.1$^{2,5}$.1$^{7,10}$]dodec-3-ene,
8-hydroxy-8-methyltetracyclo[4.4.0.1$^{2,5}$.1$^{7,10}$]dodec-3-ene,
8-hydroxy-8-ethyltetracyclo[4.4.0.1$^{2,5}$.1$^{7,10}$]dodec-3-ene,
8-carboxy-8-methyltetracyclo[4.4.0.1$^{2,5}$.1$^{7,10}$]dodec-3-ene,
8-carboxy-8-ethyltetracyclo[4.4.0.1$^{2,5}$.1$^{7,10}$]dodec-3-ene,
8-hydroxymethyl-8-methyltetracyclo[4.4.0.1$^{2,5}$.1$^{7,10}$]dodec-3-ene,
8-hydroxymethyl-8-ethyltetracyclo[4.4.0.1$^{2,5}$.1$^{7,10}$]dodec-3-ene,
8-(2'-hydroxyethyl)-8-methyltetracyclo[4.4.0.1$^{2,5}$.1$^{7,10}$]dodec-3-ene,
8-(2'-hydroxyethyl)-8-ethyltetracyclo[4.4.0.1$^{2,5}$.1$^{7,10}$]dodec-3-ene,
8-methoxy-8-methyltetracyclo[4.4.0.1$^{2,5}$.1$^{7,10}$]dodec-3-ene,
8-methoxy-8-ethyltetracyclo[4.4.0. 1$^{2,5}$.1$^{7,10}$]dodec-3-ene,
8-ethoxy-8-methyltetracyclo[4.4.0.1$^{2,5}$.1$^{7,10}$]dodec-3-ene,
8-ethoxy-8-ethyltetracyclo[4.4.0.1$^{2,5}$.1$^{7,10}$]dodec-3-ene, 8-(1'-methoxyethoxy)-8-methyltetracyclo[4.4.0.1$^{2,5}$.1$^{7,10}$]dodec-3-ene,
8-(1'-ethoxyethoxy)-8-methyltetracyclo[4.4.0.1$^{2,5}$.1$^{7,10}$]dodec-3-ene,
8-(1'-n-propoxyethoxy)-8-methyltetracyclo[4.4.0.1$^{2,5}$.1$^{7,10}$]dodec-3-ene,
8-(1'-n-butoxyethoxy)-8-methyltetracyclo[4.4.0.1$^{2,5}$.1$^{7,10}$]dodec-3-ene,
8-(1'-cyclohexyloxyethoxy)-8-methyltetracyclo[4.4.0.1$^{2,5}$.1$^{7,10}$]dodec-3-ene,
8-methoxycarbonyloxy-8-methyltetracyclo[4.4.0. 1 2,5.1 7,10]dodec-3-ene,
8-ethoxycarbonyloxy-8-methyltetracyclo[4.4.0.1$^{2,5}$.1$^{7,10}$]dodec-3-ene,
8-n-propoxycarbonyloxy-8-methyltetracyclo[4.4.0.1$^{2,5}$.1$^{7,10}$]dodec-3-ene,
8-n-butoxycarbonyloxy-8-methyltetracyclo[4.4.0.1$^{2,5}$.1$^{7,10}$]dodec-3-ene,
8-(1'-methoxyethoxy)methyl-8-methyltetracyclo[4.4.0.1$^{2,5}$.1$^{7,10}$]dodec-3-ene,
8-(1'-ethoxyethoxy)methyl-8-methyltetracyclo[4.4.0.1$^{2,5}$.1$^{7,10}$]dodec-3-ene,
8-(1'-n-propoxyethoxy)methyl-8-methyltetracyclo[4.4.0.1$^{2,5}$.1$^{7,10}$]dodec-3-ene,
8-(1'-n-butoxyethoxy)methyl-8-methyltetracyclo[4.4.0.1$^{2,5}$.1$^{7,10}$]dodec-3-ene,
8-(1'-cyclohexyloxyethoxy)methyl-8-methyltetracyclo[4.4.0.1$^{2,5}$.1$^{7,10}$]dodec-3-ene,
8-methoxycarbonyloxymethyl-8-methyltetracyclo[4.4.0.1$^{2,5}$.1$^{7,10}$]dodec-3-ene,
8-ethoxycarbonyloxymethyl-8-methyltetracyclo[4.4.0.1$^{2,5}$.1$^{7,10}$]dodec-3-ene,
8-n-propoxycarbonyloxymethyl-8-methyltetracyclo[4.4.0.1$^{2,5}$.1$^{7,10}$]dodec-3-ene,
8-n-butoxycarbonyloxymethyl-8-methyltetracyclo[4.4.0.1$^{2,5}$.1$^{7,10}$]dodec-3-ene,
8-tetrahydrofuranyloxy-8-methyltetracyclo[4.4.0.1$^{2,5}$.1$^{7,10}$]dodec-3-ene,
8-tetrahydropyranyloxy-8-methyltetracyclo[4.4.0.1$^{2,5}$.1$^{7,10}$]dodec-3-ene,
8-tetrahydrofuranyloxymethyl-8-methyltetracyclo[4.4.0.1$^{2,5}$.1$^{7,10}$]dodec-3-ene,
8-tetrahydropyranyloxymethyl-8-methyltetracyclo[4.4.0.1$^{2,5}$.1$^{7,10}$]dodec-3-ene,
8-hydroxy-9-methyltetracyclo[4.4.0.1$^{2,5}$.1$^{7,10}$]dodec-3-ene,
8-hydroxy-9-ethyltetracyclo[4.4.0.1$^{2,5}$.1$^{7,10}$]dodec-3-ene,
8-carboxy-9-methyltetracyclo[4.4.0.1$^{2,5}$.1$^{7,10}$]dodec-3-ene,
8-carboxy-9- ethyltetracyclo[4.4.0.1$^{2,5}$.1$^{7,10}$]dodec-3-ene,
8-hydroxymethyl-9-methyltetracyclo[4.4.0.1$^{2,5}$.1$^{7,10}$]dodec-3-ene, 8-hydroxymethyl-9-ethyltetracyclo[4.4.0.1$^{2,5}$.1$^{7,10}$]dodec-3-ene,
8-(2'-hydroxyethyl)-9-methyltetracyclo[4.4.0.1$^{2,5}$.1$^{7,10}$]dodec-3-ene,
8-(2'-hydroxy9-ethyltetracyclo[4.4.0.1$^{2,5}$.1$^{7,10}$]dodec-3-ene,
8-methoxy-9-methyltetracyclo[4.4.0.1$^{2,5}$.1$^{7,10}$]dodec-3-ene,
8-methoxy-9-ethyltetracyclo[4.4.0.1$^{2,5}$.1$^{7,10}$]dodec-3-ene,
8-ethoxy-9-methyltetracyclo[4.4.0.1$^{2,5}$.1$^{7,10}$]dodec-3-ene,
8-ethoxy-9-ethyltetracyclo[4.4.0.1$^{2,5}$.1$^{7,10}$]dodec-3-ene,
8-cyanotetracyclo[4.4.0.1$^{2,5}$.1$^{7,10}$]dodec-3-ene,
8-cyanomethyltetracyclo[4.4.0.1$^{2,5}$.1$^{7,10}$]dodec-3-ene,
8-(2'-cyanoethyl)tetracyclo[4.4.0.1$^{2,5}$.1$^{7,10}$]dodec-3-ene,
8,9-dicyanotetracyclo[4.4.0.1$^{2,5}$.1$^{7,10}$]dodec-3-ene,
8,9-di(cyanomethyl)tetracyclo[4.4.0.1$^{2,5}$.1$^{7,10}$]dodec-3-ene,
8,9-di(2'-cyanoethyl)tetracyclo[4.4.0.1$^{2,5}$.1$^{7,10}$]dodec-3-ene,
8-cyano-8-methyltetracyclo[4.4.0.1$^{2,5}$.1$^{7,10}$]dodec-3-ene,
8-cyano-8-ethyltetracyclo[4.4.0.1$^{2,5}$.1$^{7,10}$]dodec-3-ene,
8-cyanomethyl-8-methyltetracyclo[4.4.0.1$^{2,5}$.1$^{7,10}$]dodec-3-ene,
8-cyanomethyl-8-ethyltetracyclo[4.4.0.1$^{2,5}$.1$^{7,10}$]dodec-3-ene,
8-(2'-cyanoethyl)-8-methyltetracyclo[4.4.0.1$^{2,5}$.1$^{7,10}$]dodec-3-ene, 8-(2'-cyanoethyl)-8-ethyltetracyclo[4.4.0.1$^{2,5}$.1$^{7,10}$]dodec-3-ene,
8-cyano-9-methyltetracyclo[4.4.0.1$^{2,5}$.1$^{7,10}$]dodec-3-ene,
8-cyano-9- ethyltetracyclo[4.4.0.1$^{2,5}$.1$^{7,10}$]dodec-3-ene,
8-cyanomethyl-9-methyltetracyclo[4.4.0.1$^{2,5}$.1$^{7,10}$]dodec-3-ene,
8-cyanomethyl-9-ethyltetracyclo[4.4.0.1$^{2,5}$.1$^{7,10}$]dodec-3-ene,
8-(2'-cyanoethyl)-9-methyltetracyclo[4.4.0.1$^{2,5}$.1$^{7,10}$]dodec-3-ene, 8-(2'-cyanoethyl)-9-ethyltetracyclo[4.4.0.1$^{2,5}$.1$^{7,10}$]dodec-3-ene, and
8,9-dicarboxytetracyclo[4.4.0.1$^{2,5}$.1$^{7,10}$]dodec-3-ene anhydride; and the like.

Of these norbornene derivatives (I), the following compounds are preferable:
5-hydroxybicyclo[2.2.1]hept-2-ene,
5-hydroxymethylbicyclo[2.2.1]hept-2-ene,
5-(1'-ethoxyethoxy)bicyclo[2.2.1]hept-2-ene,
5-n-butoxycarbonyloxybicyclo[2.2.1]hept-2-ene,
5-(1'-ethoxyethoxy)methylbicyclo[2.2.1]hept-2-ene,
5-n-butoxycarbonyloxymethylbicyclo[2.2.1]hept-2-ene,
5,6-dihydroxybicyclo[2.2.1]hept-2-ene,
5,6-di(hydroxymethyl)bicyclo[2.2.1]hept-2-ene,
5,6-di(1'-ethoxyethoxy)bicyclo[2.2.1]hept-2-ene,
5,6-di-n-butoxycarbonyloxybicyclo[2.2.1]hept-2-ene,
5,6-di[(1'-ethoxyethoxy)methyl]bicyclo[2.2.1]hept-2-ene,
5,6-di(n-butoxycarbonyloxymethyl)bicyclo[2.2.1]hept-2-ene,
5-hydroxy-5-methylbicyclo[2.2.1]hept-2-ene,
5-hydroxymethyl-5-methylbicyclo[2.2.1]hept-2-ene,
5-(1'-ethoxyethoxy)-5-methylbicyclo[2.2.1]hept-2-ene,
5-n-butoxycarbonyloxy-5-methylbicyclo[2.2.1]hept-2-ene,
5-(1'-ethoxyethoxy)methyl-5-methylbicyclo[2.2.1]hept-2-ene,
5-n-butoxycarbonyloxymethyl-5-methylbicyclo[2.2.1]hept-2-ene, 5-hydroxy-6-methylbicyclo[2.2.1]hept-2-ene,
5-hydroxymethyl-6-methylbicyclo[2.2.1]hept-2-ene,
5-cyanobicyclo[2.2.1]hept-2-ene,
5-cyanomethylbicyclo[2.2.1]hept-2-ene,
5-cyano-5-methylbicyclo[2.2.1]hept-2-ene,
5-cyanomethyl-5-methylbicyclo[2.2.1]hept-2-ene,
5-cyano-6-methylbicyclo[2.2.1]hept-2-ene,
5-cyanomethyl-6-methylbicyclo[2.2.1]hept-2-ene,
5,6-dicarboxybicyclo[2.2.1]hept-2-ene anhydride (hymicanhydride),
8-hydroxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-(1'-ethoxyethoxy)tetracyclo[4.4.0.1$^{2,5}$.1$^{7,10}$]dodec-3-ene,
8-n-butoxycarbonyloxytetracyclo[4.4.0.1$^{2,5}$.1$^{7,10}$]dodec-3-ene,
8-(1'-ethoxyethoxy)methyltetracyclo[4.4.0.1$^{2,5}$.1$^{7,10}$]dodec-3-ene,
8-n-butoxycarbonyloxymethyltetracyclo[4.4.0.1$^{2,5}$.1$^{7,10}$]dodec-3-ene, 8,9-dihydroxytetracyclo[4.4.0.1$^{2,5}$.1$^{7,10}$]dodec-3-ene,
8,9-di(hydroxymethyl)tetracyclo[4.4.0.1$^{2,5}$.1$^{7,10}$]dodec-3-ene,
8,9-di(1'-ethoxyethoxy)tetracyclo[4.4.0.1$^{2,5}$.1$^{7,10}$]dodec-3-ene,
8,9-di-n-butoxycarbonyloxytetracyclo[4.4.0.1$^{2,5}$.1$^{7,10}$]dodec-3-ene,
8,9-di[(1'-ethoxyethoxy)methyl]tetracyclo[4.4.0.1$^{2,5}$.1$^{7,10}$]dodec-3-ene, 8,9-di(n-butoxycarbonyloxymethyl)tetracyclo[4.4.0.1$^{2,5}$.
1$^{7,10}$]dodec-3-ene,
8-hydroxy-8-methyltetracyclo[4.4.0.1$^{2,5}$.1$^{7,10}$]dodec-3-ene,
8-hydroxymethyl-8-ethyltetracyclo[4.4.0.1$^{2,5}$.1$^{7,10}$]dodec-3-ene,
8-(1'-ethoxyethoxy)-8-methyltetracyclo[4.4.0.1$^{2,5}$.1$^{7,10}$]dodec-3-ene,
8-n-butoxycarbonyloxy-8-methyltetracyclo[4.4.0.1$^{2,5}$.1$^{7,10}$]dodec-3-ene,
8-(1'-ethoxyethoxy)methyl-8-methyltetracyclo[4.4.0.1$^{2,5}$.1$^{7,10}$]dodec-3-ene,
8-n-butoxycarbonyloxymethyl-8-methyltetracyclo[4.4.0.1$^{2,5}$.1$^{7,10}$]dodec-3-ene,
8-hydroxy-9-methyltetracyclo[4.4.0.1$^{2,5}$.1$^{7,10}$]dodec-3-ene,
8-hydroxymethyl-9-methyltetracyclo[4.4.0.1$^{2,5}$.1$^{7,10}$]dodec-3-ene, 8-cyanotetracyclo[4.4.0.1$^{2,5}$.1$^{7,10}$]dodec-3-ene,
8-cyanomethyltetracyclo[4.4.0.1$^{2,5}$.1$^{7,10}$]dodec-3-ene,
8-cyano-8-methyltetracyclo[4.4.0.1$^{2,5}$.1$^{7,10}$]dodec-3-ene,
8-cyanomethyl-8-methyltetracyclo[4.4.0.1$^{2,5}$.1$^{7,10}$]dodec-3-ene,
8-cyano-9-methyltetracyclo[4.4.0.1$^{2,5}$.1$^{7,10}$]dodec-3-ene,
8-cyanomethyl-9-methyltetracyclo[4.4.0.1$^{2,5}$.1$^{7,10}$]dodec-3-ene, and 8,9-dicarboxytetracyclo[4.4.0.1$^{2,5}$.1$^{7,10}$]dodec-3-ene anhydride.

The recurring unit (I) may be used in the resin (A) either individually or in combination of two or more.

As examples of monomers which provide the recurring unit (I-1) in the resin (A2), norbornene derivatives (I-1) shown by the following formula (4) (hereinafter called "norbornene derivatives (I-1)") can be given:

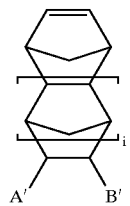

(4)

wherein A', B', and j have the same meanings as defined for the formula (I-1).

As examples of a linear or branched alkyl group having 1–4 carbon atoms for A' and B' in the norbornene derivatives (I-1), a methyl group, ethyl group, n-propyl group, i-propyl group, n-butyl group, 2-methylpropyl group, 1-methylpropyl group, t-butyl group, and the like can be given.

Of these, a methyl group and ethyl group are preferable.

As an acid-dissociable group having 20 or less carbon atoms which dissociates in the presence of an acid to produce an acidic functional group represented by A' or B' in the norbornene derivatives (I-1) (hereinafter called "acid-dissociable organic group (i)"), groups which dissociate in the presence of an acid to produce a carboxyl group are preferable.

Examples of the acid-dissociable organic group (i) include: a (cyclo)alkoxycarbonyl group such a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, n-hexyloxycarbonyl group, n-heptyloxycarbonyl group, n-octyloxycarbonyl group, n-decyloxycarbonyl group, cyclopentyloxycarbonyl group, cyclohexyloxycarbonyl group, 4-t-butylcyclohexyloxycarbonyl group, cycloheptyloxycarbonyl group, and cyclooctyloxycarbonyl group; an aryloxycarbonyl group such as a phenoxycarbonyl group, 4-t-butylphenoxycarbonyl group, and 1-naphthyloxycarbonyl group; an aralkyloxycarbonyl group such as a benzyloxycarbonyl group, 4-t-butylbenzyloxycarbonyl group, phenethyloxycarbonyl group, and 4-t-butylphenethyloxycarbonyl group; a 1-(cyclo)alkyloxyethoxycarbonyl group such as a 1-methoxyethoxycarbonyl group, 1-ethoxyethoxycarbonyl group, 1-n-propoxyethoxycarbonyl group, 1-i-propoxyethoxycarbonyl group, 1-n-butoxyethoxycarbonyl group, 1-(2'-methylpropoxy)ethoxycarbonyl group, 1-(1'-methylpropoxy)ethoxycarbonyl group, 1-t-butoxyethoxycarbonyl group, 1-cyclohexyloxyethoxycarbonyl group, and 1-(4'-t-butylcyclohexyloxy)ethoxycarbonyl group; a 1-aryloxyethoxycarbonyl group such as a 1-phenoxyethoxycarbonyl group, 1-(4'-t-butylphenoxy)ethoxycarbonyl group, and 1-(1'-naphthyloxy)ethoxycarbonyl group; a 1-aralkyloxyethoxycarbonyl group such as a 1-benzyloxyethoxycarbonyl group, 1-(4'-t-butylbenzyloxy)ethoxycarbonyl group, 1-phenethyloxyethoxycarbonyl group, and 1-(4'-t-butylphenethyloxy)ethoxycarbonyl group; a (cyclo)alkoxycarbonylmethoxycarbonyl group such as a methoxycarbonylmethoxycarbonyl group, ethoxycarbonylmethoxycarbonyl group, n-propoxycarbonylmethoxycarbonyl group, i-propoxycarbonylmethoxycarbonyl group, n-butoxycarbonylmethoxycarbonyl group, 2-methylpropoxycarbonylmethoxycarbonyl group, 1-methylpropoxycarbonylmethoxycarbonyl group, t-butoxycarbonylmethoxycarbonyl group, cyclohexyloxycarbonylmethoxycarbonyl group, and 4-t-butylcyclohexyloxycarbonylmethoxycarbonyl group; a (cyclo)alkoxycarbonylmethyl group such as a methoxycarbonylmethyl group, ethoxycarbonylmethyl group, n-propoxycarbonylmethyl group, i-propoxycarbonylmethyl group, n-butoxycarbonylmethyl group, 2-methylpropoxycarbonylmethyl group, 1-methylpropoxycarbonylmethyl group, t-butoxycarbonylmethyl group, cyclohexyloxycarbonylmethyl group, and 4-t-butylcyclohexyloxycarbonylmethyl group; an aryloxycarbonylmethyl group such as a phenoxycarbonylmethyl group, 4-t-butylphenoxycarbonylmethyl group, and 1-naphthyloxycarbonylmethyl group; an aralkyloxycarbonylmethyl group such as a benzyloxycarbonylmethyl group, 4-t-butylbenzyloxycarbonylmethyl group, phenethyloxycarbonylmethyl group, and 4-t-butylphenethyloxycarbonylmethyl group; a 2-(cyclo)alkoxycarbonylethyl group such as a 2-methoxycarbonylethyl group, 2-ethoxycarbonylethyl group, 2-n-propoxycarbonylethyl group, 2-i-propoxycarbonylethyl group, 2-n-butoxycarbonylethyl group, 2-(2'-methylpropoxy)carbonylethyl group, 2-(1'-methylpropoxy)carbonylethyl group, 2-t-butoxycarbonylethyl group, 2-cyclohexyloxycarbonylethyl group, and 2-(4'-t-butylcyclohexyloxycarbonyl)ethyl group; a 2-aryloxycarbonylethyl group such as a 2-phenoxycarbonylethyl group, 2-(4'-t-butylphenoxycarbonyl)ethyl group, and 2-(1'-naphthyloxycarbonyl)ethyl group; a 2-aralkyloxycarbonylethyl group such as a 2-benzyloxycarbonylethyl group, 2-(4'-t-butylbenzyloxycarbonyl)ethyl group, 2-phenethyloxycarbonylethyl group, and 2-(4'-t- butylphenethyloxycarbonyl)ethyl group; a tetrahydrofuranyloxycarbonyl group; a tetrahydropyranyloxycarbonyl group; and the like.

Of these acid-dissociable organic groups (i), groups having a formula —COOR' (wherein R' represents a (cyclo) alkyl group having 1–19 carbon atoms) or —COOCH$_2$COOR" (wherein R" represents a (cyclo)alkyl group having 1–17 carbon atoms) are preferable, with a 1-methylpropoxycarbonyl group, t-butoxycarbonyl group, and t-butoxycarbonylmethoxycarbonyl group being particularly preferable.

i in the norbornene derivatives (I-1) is preferably either 0 or 1.

The norbornene derivatives (I-1) may be used in the resin (A2) either individually or in combination of two or more.

Examples of the norbornene derivatives (I-1) include:
5-methoxycarbonylbicyclo[2.2.1]hept-2-ene,
5-ethoxycarbonylbicyclo[2.2.1]hept-2-ene,
5-n-propoxycarbonylbicyclo[2.2.1]hept-2-ene,
5-i-propoxycarbonylbicyclo[2.2.1]hept-2-ene,
5-n-butoxycarbonylbicyclo[2.2.1]hept-2-ene,
5-(2'-methylpropoxy)carbonylbicyclo[2.2.1]hept-2-ene,
5-(1'-methylpropoxy)carbonylbicyclo[2.2.1]hept-2-ene,
5-t-butoxycarbonylbicyclo[2.2.]hept-2-ene,
5-cyclohexyloxycarbonylbicyclo[2.2.1]hept-2-ene,
5-(4'-t-butylcyclohexyloxy)carbonylbicyclo[2.2.1]hept-2-ene,
5-phenoxycarbonylbicyclo[2.2.1]hept-2-ene,
5-(1'-ethoxyethoxy)carbonylbicyclo[2.2.1]hept-2-ene,
5-(1'-cyclohexyloxyethoxy)carbonylbicyclo[2.2.1]hept-2-ene,
5-t-butoxycarbonylmethoxycarbonylbicyclo[2.2.1]hept-2-ene,
5-tetrahydrofuranyloxycarbonylbicyclo[2.2.1]hept-2-ene,
5-tetrahydropyranyloxycarbonylbicyclo[2.2.1]hept-2-ene,
5,6-di(methoxycarbonyl)bicyclo[2.2.1]hept-2-ene,
5,6-di(ethoxycarbonyl)bicyclo[2.2.1]hept-2-ene,
5,6-di(n-propoxycarbonyl)bicyclo[2.2.1]hept-2-ene,
5,6-di(i-propoxycarbonyl)bicyclo[2.2.1]hept-2-ene,
5,6-di(n-butoxycarbonyl)bicyclo[2.2.1]hept-2-ene,
5,6-di(2-methylpropoxycarbonyl)bicyclo[2.2.1]hept-2-ene,
5,6-di(1'-methylpropoxycarbonyl)bicyclo[2.2.1]hept-2-ene,
5, 6-di (t-butoxycarbonyl)bicyclo[2.2.1]hept-2-ene,
5,6-di(cyclohexyloxycarbonyl)bicyclo[2.2.1]hept-2-ene,
5, 6-di (4'-t-butylcyclohexyloxycarbonyl) bicyclo [2.2.1] hept-2-ene, 5,6-di(phenoxycarbonyl)bicyclo[2.2.1]hept-2-ene,
5,6-di(1'-ethoxyethoxycarbonyl)bicyclo[2.2.1]hept-2-ene,
5,6-di(1'-cyclohexyloxyethoxycarbonyl)bicyclo[2.2.1]hept-2-ene,
5,6-di(t-butoxycarbonylmethoxycarbonyl)bicyclo[2.2.1]hept-2-ene,
5,6-di(tetrahydrofuranyloxycarbonyl)bicyclo[2.2.1]hept-2-ene,
5,6-di(tetrahydropyranyloxycarbonyl)bicyclo [2.2.1]hept-2-ene,
8-methoxycarbonyltetracyclo [4.4.0.1$^{2,5}$.1$^{7,10}$]dodec-3-ene,
8-ethoxycarbonyltetracyclo[4.4.0.1$^{2,5}$.1$^{7,10}$]dodec-3-ene,
8-n-propoxycarbonyltetracyclo[4.4.0.1$^{2,5}$.1$^{7,10}$]dodec-3-ene,
8-i-propoxycarbonyltetracyclo[4.4.0.1$^{2,5}$.1$^{7,10}$]dodec-3-ene,
8-n-butoxycarbonyltetracyclo[4.4.0.1$^{2,5}$.1$^{7,10}$]dodec-3-ene,
8-(2'-methylpropoxy)carbonyltetracyclo[4.4.0.1$^{2,5}$.1$^{7,10}$]dodec-3-ene,
8-(1'-methylpropoxy)carbonyltetracyclo[4.4.0.1$^{2,5}$.7,10]dodec-3-ene,
8-t-butoxycarbonyltetracyclo[4.4.0.1$^{2,5}$.1$^{7,10}$]dodec-3-ene,
8-cyclohexyloxycarbonyltetracyclo[4.4.0.1$^{2,5}$.1$^{7,10}$]dodec-3-ene,
8-(4'-t-butylcyclohexyloxy)carbonyltetracyclo[4.4.0.1$^{2,5}$.1$^{7,10}$]dodec-3-ene,
8-phenoxycarbonyltetracyclo[4.4.0.1$^{2,5}$.1$^{7,10}$]dodec-3-ene,
8-(1'-ethoxyethoxy)carbonyltetracyclo[4.4.0.1$^{2,5}$.1$^{7,10}$]dodec-3-ene,
8-(1'-cyclohexyloxyethoxy)carbonyltetracyclo[4.4.0.1$^{2,5}$.1$^{7,10}$]dodec-3-ene,
8-t-butoxycarbonylmethoxycarbonyltetracyclo[4.4.0.1$^{2,5}$.1$^{7,10}$]dodec-3-ene,
8-tetrahydrofuranyloxycarbonyltetracyclo[4.4.0.1$^{2,5}$.1$^{7,10}$]dodec-3-ene,
8-tetrahydropyranyloxycarbonyltetracyclo[4.4.0.1$^{2,5}$.1$^{7,10}$]dodec-3-ene,
8,9-di(methoxycarbonyl)tetracyclo[4.4.0.1$^{2,5}$.1$^{7,10}$]dodec-3-ene,
8,9-di(ethoxycarbonyl)tetracyclo[4.4.0.1$^{2,5}$.1$^{7,10}$]dodec-3-ene,
8,9-di(n-propoxycarbonyl)tetracyclo[4.4.0.1$^{2,5}$.1$^{7,10}$]dodec-3-ene,
8,9-di(i-propoxycarbonyl)tetracyclo[4.4.0.1$^{2,5}$.1$^{7,10}$]dodec-3-ene,
8,9-di(n-butoxycarbonyl)tetracyclo[4.4.0.1$^{2,5}$.1$^{7,10}$]dodec-3-ene,
8,9-di(2'-methylpropoxycarbonyl)tetracyclo[4.4.0.1$^{2,5}$.1$^{7,10}$]dodec-3-ene,
8,9-di(1'-methylpropoxycarbonyl)tetracyclo[4.4.0.1$^{2,5}$.1$^{7,10}$]dodec-3-ene,
8,9-di(t-butoxycarbonyl)tetracyclo[4.4.0.1$^{2,5}$.1$^{7,10}$]dodec-3-ene,
8,9-di(cyclohexyloxycarbonyl)tetracyclo[4.4.0.1$^{2,5}$.1$^{7,10}$]dodec-3-ene,
8,,9-di(4'-t-butylcyclohexyloxycarbonyl)tetracyclo[4.4.0.1$^{2,5}$.1$^{7,10}$]dodec-3-ene,
8,9-di(phenoxycarbonyl)tetracyclo[4.4.0.1$^{2,5}$.1$^{7,10}$]dodec-3-ene,
8,9-di(1'-ethoxyethoxycarbonyl)tetracyclo[4.4.0.1$^{2,5}$.1$^{7,10}$]dodec-3-ene,
8,9-di(1'-cyclohexyloxyethoxycarbonyl)tetracyclo[4.4.0.1$^{2,5}$.1$^{7,10}$]dodec-3-ene,
8,9-di(t-butoxycarbonylmethoxycarbonyl)tetracyclo[4.4.0.1$^{2,5}$.1$^{7,10}$]dodec-3-ene,
8,9-di(tetrahydrofuranyloxycarbonyl)tetracyclo[4.4.0.1$^{2,5}$.1$^{7,10}$]dodec-3-ene,
8,9-di(tetrahydropyranyloxycarbonyl)tetracyclo[4.4.0.1$^{2,5}$.1$^{7,10}$]dodec-3-ene, and the like.

Of these norbornene derivatives (I-1), the following compounds are preferable:
5-t-butoxycarbonylbicyclo[2.2.1]hept-2-ene,
5-t-butoxycarbonylmethoxycarbonylbicyclo[2.2.1]hept-2-ene,
5,6-di(t-butoxycarbonyl)bicyclo[2.2.1]hept-2-ene,
5,6-di(t-butoxycarbonylmethoxycarbonyl)bicyclo[2.2.1]hept-2-ene,
8-t-butoxycarbonyltetracyclo[4.4.0.1$^{2,5}$.1$^{7,10}$]dodec-3-ene,
8-t-butoxycarbonylmethoxycarbonyltetracyclo[4.4.0.1$^{2,5}$.1$^{7,10}$]dodec-3-ene,
8,9-di(t-butoxycarbonyl)tetracyclo[4.4.0.1$^{2,5}$.1$^{7,10}$]dodec-3-ene, and
8,9-di(t-butoxycarbonylmethoxycarbonyl)tetracyclo[4.4.0.1$^{2,5}$.1$^{7,10}$]dodec-3-ene.

As examples of monomers which provide the recurring unit (I-2) in the resin (A2), norbornene derivatives shown by the following formula (5) (hereinafter called "norbornene derivatives (I-2)") can be given:

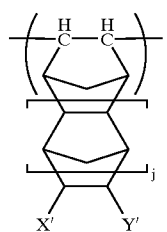

(5)

wherein X', Y', and j have the same meanings as defined for the formula (I-2).

As examples of a linear or branched alkyl group having 1–4 carbon atoms for X' and Y' in the norbornene derivatives (I-2), a methyl group, ethyl group, n-propyl group, i-propyl group, n-butyl group, 2-methylpropyl group, 1-methylpropyl group, t-butyl group, and the like can be given.

Of these, a methyl group and ethyl group are preferable.

As examples of the monovalent oxygen-containing polar group and the monovalent nitrogen-containing polar group for X' and Y' in the norbornene derivatives (I-2), groups given as examples of the monovalent oxygen-containing polar group and the monovalent nitrogen-containing polar group for X and Y in the norbornene derivatives (I) can be given. In the norbornene derivatives (I-2), both X' and Y' may be either the oxygen-containing polar groups or the nitrogen-containing polar groups, or one of X'and Y'may be the oxygen-containing polar group and the other may be the nitrogen-containing polar group.

j in the norbornene derivatives (I-2) is preferably either 0 or 1.

The norbornene derivatives (I-2) may be used in the resin (A2) either individually or in combination of two or more.

Examples of the norbornene derivatives (I-2) include:
5-hydroxybicyclo[2.2.1]hept-2-ene,
5-hydroxymethylbicyclo[2.2.1]hept-2-ene,
5-(2'-hydroxyethyl)bicyclo[2.2.1]hept-2-ene,
5-hydroxy-6-methylbicyclo[2.2.1]hept-2-ene,
5-hydroxymethyl-6-methylbicyclo[2.2.1]hept-2-ene,
5-(2'-hydroxyethyl)-6-methylbicyclo[2.2.1]hept-2-ene,
5-hydroxy-6-ethylbicyclo[2.2.1]hept-2-ene,
5-hydroxymethyl-6-ethylbicyclo[2.2.1]hept-2-ene,
5-(2'-hydroxyethyl)-6-ethylbicyclo[2.2.1]hept-2-ene,
5-cyanobicyclo[2.2.1]hept-2-ene,
5-cyanomethylbicyclo[2.2.1]hept-2-ene,
5-(2'-cyanoethyl)bicyclo[2.2.1]hept-2-ene,
5 5-cyano-6-methylbicyclo[2.2.1]hept-2-ene,
5-cyanomethyl-6-methylbicyclo[2.2.1]hept-2-ene,
5-(2'-cyanoethyl)-6-methylbicyclo[2.2.1]hept-2-ene,
5-cyano-6-ethylbicyclo[2.2.1]hept-2-ene,
5-cyanomethyl-6-ethylbicyclo[2.2.1]hept-2-ene,
5-(2'-cyanoethyl)-6-ethylbicyclo[2.2.1]hept-2-ene,
5, 6-dicyanobicyclo[2.2.1]hept-2-ene,
5,6-di(cyanomethyl)bicyclo[2.2.1]hept-2-ene,
5,6-di(2'-cyanoethyl)bicyclo[2.2.1]hept-2-ene,
8-hydroxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-(2'-hydroxyethyl)tetracyclo[4.4.0.1$^{2,5}$.1$^{7,10}$]dodec-3-ene,
8-hydroxy-9-methyltetracyclo[4.4.0.1$^{2,5}$.1$^{7,10}$]dodec-3-ene,
8-hydroxymethyl-9-methyltetracyclo[4.4.0.1$^{2,5}$.1$^{7,10}$]dodec-3-ene,
8-(2'-hydroxyethyl)-9-methyltetracyclo[4.4.0.1$^{2,5}$.1$^{7,10}$]dodec-3-ene,
8-hydroxy-9-ethyltetracyclo [4.4.0.1$^{2,5}$.1$^{7,10}$]dodec-3-ene,
8-hydroxymethyl-9-ethyltetracyclo[4.4.0.1$^{2,5}$.1$^{7,10}$]dodec-3-ene,
8-(2'-hydroxyethyl)-9-ethyltetracyclo[4.4.0.1$^{2,5}$.1$^{7,10}$]dodec-3-ene,
8-cyanotetracyclo[4.4.0.1$^{2,5}$.1$^{7,10}$]dodec-3-ene,
8-cyanomethyltetracyclo[4.4.0.1$^{2,5}$.1$^{7,10}$]dodec-3-ene,
8-(2'-cyano ethyl)tetracyclo[4.4.0.1$^{2,5}$.1$^{7,10}$]dodec-3-ene,
8-cyano-9-methyltetracyclo[4.4.0.1$^{2,5}$.1$^{7,10}$]dodec-3-ene,
8-cyanomethyl-9-methyltetracyclo[4.4.0.1$^{2,5}$.1$^{7,10}$]dodec-3-ene,
5 8-(2'-cyanoethyl)-9-methyltetracyclo[4.4.0.1$^{2,5}$.1$^{7,10}$]dodec-3-ene, 8-cyano-9-ethyltetracyclo[4.4.0.1$^{2,5}$.1$^{7,10}$]dodec-3-ene,
8-cyanomethyl-9-ethyltetracyclo[4.4.0.1$^{2,5}$.1$^{7,10}$]dodec-3-ene,
8-(2'-cyanoethyl)-9-ethyltetracyclo[4.4.0.1$^{2,5}$.1$^{7,10}$]dodec-3-ene, 8,9-dicyanotetracyclo[4.4.0.1$^{2,5}$.1$^{7,10}$]dodec-3-ene,
8,9-di(cyanomethyl)tetracyclo[4.4.0.1$^{2,5}$.1$^{7,10}$]dodec-3-ene,
8,9-di(2'-cyanoethyl)tetracyclo[4.4.0.1$^{2,5}$.1$^{7,10}$]dodec-3-ene, and the like.

Of these norbornene derivatives (I-2), the following compounds are preferable:
5-hydroxybicyclo[2.2.1]hept-2-ene,
5-hydroxymethylbicyclo[2.2.1]hept-2-ene,
5-hydroxy-6-methylbicyclo[2.2.1]hept-2-ene,
5-hydroxymethyl-6-methylbicyclo[2.2.1]hept-2-ene,
5-cyanobicyclo[2.2.1]hept-2-ene,
5-cyanomethylbicyclo[2.2.1]hept-2-ene,
5-cyano-6-methylbicyclo[2.2.1]hept-2-ene,
5-cyanomethyl-6-methylbicyclo[2.2.1]hept-2-ene,
8-hydroxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-hydroxy-9-methyltetracyclo[4.4.0.1$^{2,5}$.1$^{7,10}$]dodec-3-ene,
8-hydroxymethyl-9-methyltetracyclo[4.4.0.1$^{2,5}$.1$^{7,10}$]dodec-3-ene, 8-cyanotetracyclo[4.4.0.1$^{2,5}$.1$^{7,10}$]dodec-3-ene,
8-cyanomethyltetracyclo[4.4.0.1$^{2,5}$.1$^{7,10}$]dodec-3-ene,
8-cyano-9-methyltetracyclo[4.4.0.1$^{2,5}$.1$^{7,10}$]dodec-3-ene, and
8-cyanomethyl-9-methyltetracyclo[4.4.0.1$^{2,5}$.1$^{7,10}$]dodec-3-ene The recurring unit (II) shown by the formula (II) is derived from maleic anhydride. Maleic anhydride exhibits good copolymerizability with the norbornene derivatives (I), norbornene derivatives (I-1), and the norbornene derivatives (I-2). Therefore, the molecular weight of the resulting resin (A1) and the resin (A2) can be adjusted to a desired value by copolymerization of maleic anhydride with these norbornene derivatives.

The recurring unit (III-1) shown by the formula (III-1) is derived from a compound in which a hydrogen atom of a carboxyl group in (meth) acrylic acid is replaced by a protecting group $R^2$ (hereinafter called "(meth)acrylic acid derivatives (III-1)"). The recurring unit (III-2) shown by the formula (III-2) is derived from a compound in which a hydrogen atom of a carboxyl group in (meth) acrylic acid is replaced by a group —$R^4$—Z (wherein Z represents a protecting group (t-butoxycarbonyl group)) (hereinafter called "(meth)acrylic acid derivatives (III-2)"). The protecting groups in both the recurring units (III-1) and (III-2) dissociate by the action of an acid generated from an acid generator (B) to form a carbokyl group, thereby providing the resin (A1) and the resin (A2) with alkali-solubility.

In the (meth)acrylic acid derivatives (III-1), as examples of a monovalent alicyclic hydrocarbon group having 4–20 carbon atoms for $R^3$ and a divalent alicyclic hydrocarbon group having 4–20 carbon atoms formed by two $R^3$s bonded together in the group $R^2$, alicyclic hydrocarbon groups derived from norbornane, tricyclodecane, tetracyclododecane, adamantane, or cycloalkanes such as cyclobutane, cyclopentane, cyclohexane, cycloheptane, and cyclooctane; the alicyclic hydrocarbon groups substituted by at least one of linear, branched, or cyclic alkyl groups having 1–8 carbon atoms such as a methyl group, ethyl group, n-propyl group, i-propyl group, n-butyl group, 2-methylpropyl group, 1-methylpropyl group, and t-butyl group; and the like can be given.

Of these monovalent and divalent alicyclic hydrocarbon groups, alicyclic hydrocarbon groups derived from norbornane, tricyclodecane, tetracyclododecane, or adamantane, the above alicyclic hydrocarbon groups substituted by the above alkyl groups are preferable.

As examples of derivatives of the monovalent or divalent alicyclic hydrocarbon groups, groups having one or more substituents such as a hydroxyl group; a carboxyl group; a linear or branched hydroxyalkyl group having 1–4 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; a linear or branched alkoxyl group having 1–4 carbon atoms such as a methoxy group, ethoxy group, n-propoxy group, i-propoxy group, n-butoxy group, 2-methylpropoxy group, 1-methylpropoxy group, and t-butoxy group; a cyano group; a linear or branched cyanoalkyl group having 2–5 carbon atoms such as a cyanomethyl group, 1-cyanoethyl group, 2-cyanoethyl group, 1-cyanopropyl group, 2-cyanopropyl group, 3-cyanopropyl group, 1-cyanobutyl group, 2-cyanobutyl group, 3-cyanobutyl group, and 4-cyanobutyl group; and the like can be given.

Of these substituents, a hydroxyl group, carboxyl group, hydroxymethyl group, cyano group, and the like are preferable.

As examples of linear or branched alkyl groups having 1–4 carbon atoms for $R^3$ in the group $R^2$, a methyl group, ethyl group, n-propyl group, i-propyl group, n-butyl group, 2-methylpropyl group, 1-methylpropyl group, t-butyl group, and the like can be given.

Of these, a methyl group and ethyl group are preferable.

Compounds shown by the following formulas (iii-1) to (iii-98) can be given as preferable examples of the (meth) acrylic acid derivatives (III-1).

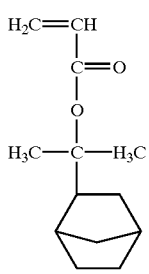
(iii-1)

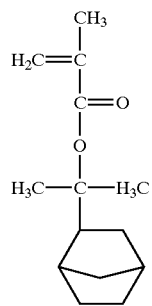
(iii-2)

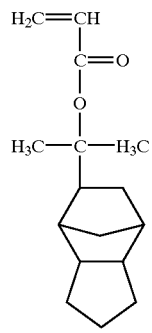
(iii-3)

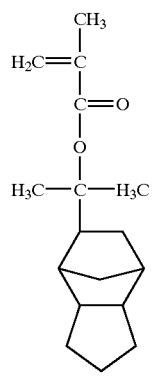
(iii-4)

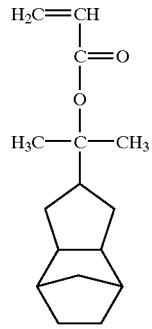
(iii-5)

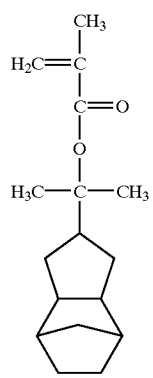 (iii-6)
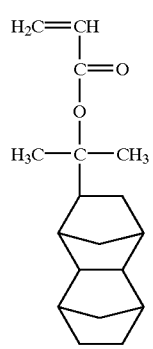 (iii-7)
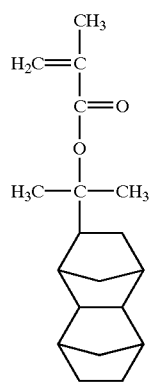 (iii-8)
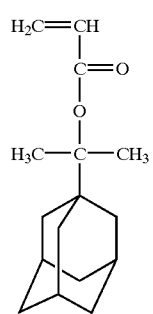 (iii-9)
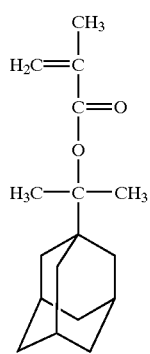 (iii-10)
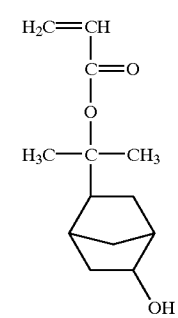 (iii-11)
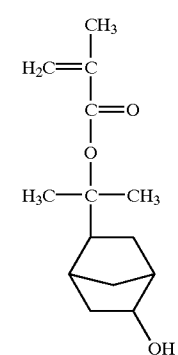 (iii-12)
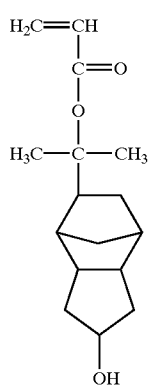 (iii-13)

(iii-14)
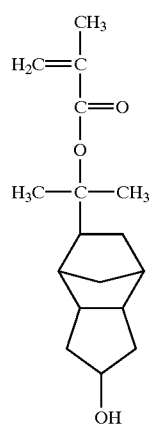
(iii-15)
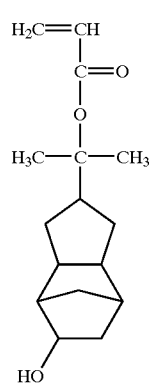
(iii-16)
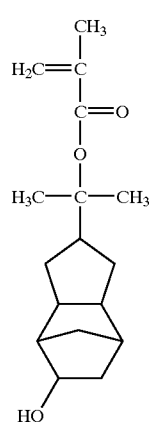
(iii-17)
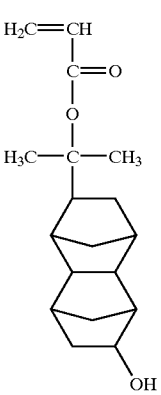
(iii-18)
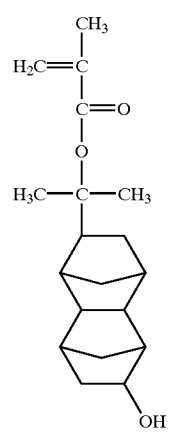
(iii-19)
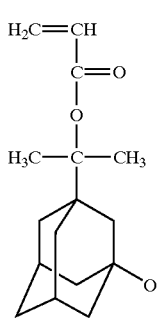
(iii-20)
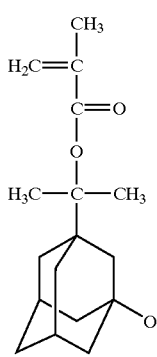
(iii-21)
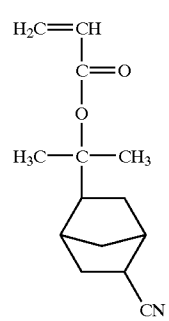

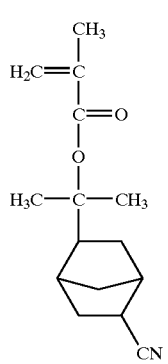 (iii-22)
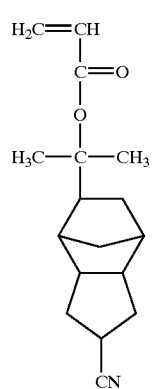 (iii-23)
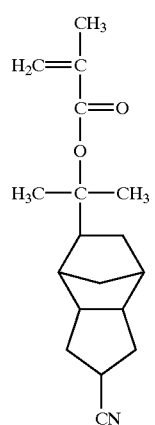 (iii-24)
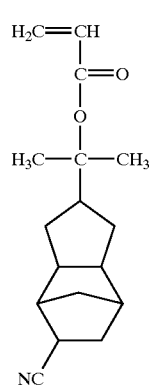 (iii-25)
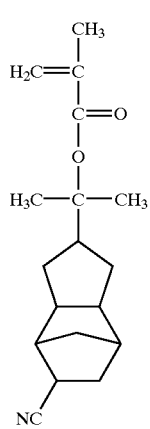 (iii-26)
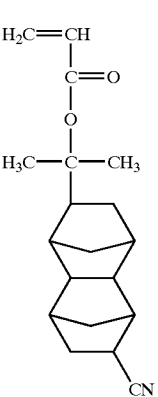 (iii-27)
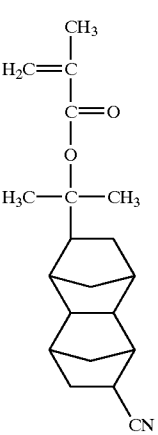 (iii-28)
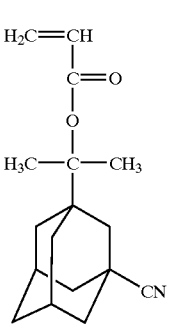 (iii-29)

(iii-30) 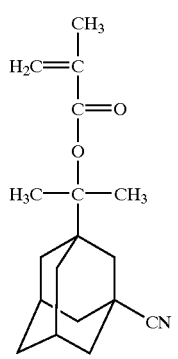
(iii-31) 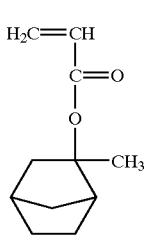
(iii-32) 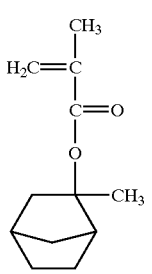
(iii-33) 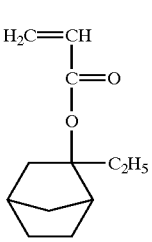
(iii-34) 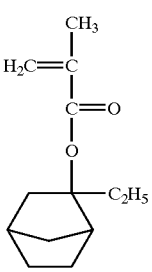
(iii-35) 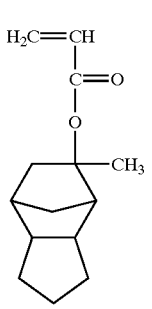
(iii-36) 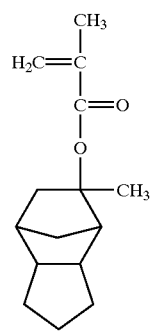
(iii-37) 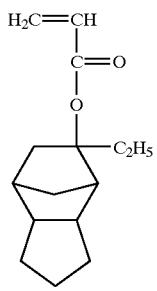
(iii-38) 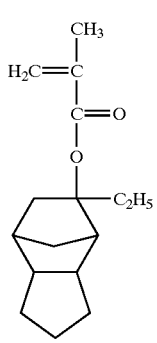
(iii-39) 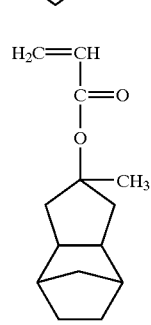
(iii-40) 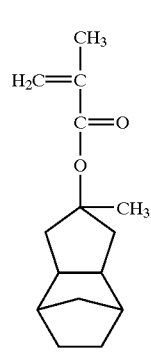

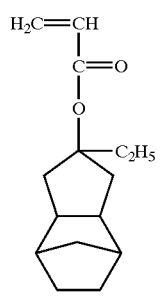 (iii-41)
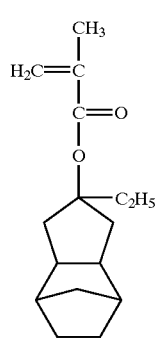 (iii-42)
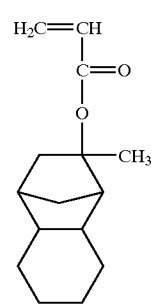 (iii-43)
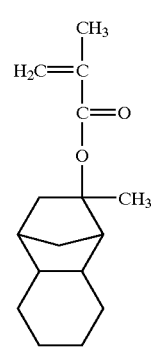 (iii-44)
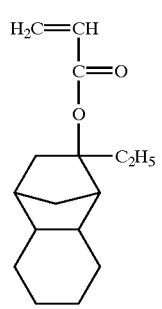 (iii-45)
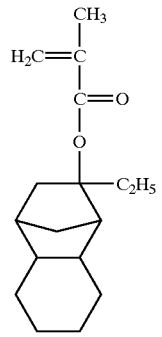 (iii-46)
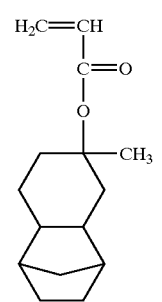 (iii-47)
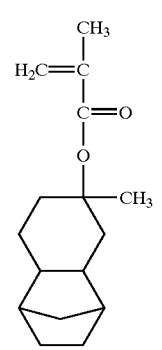 (iii-48)
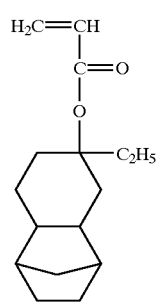 (iii-49)
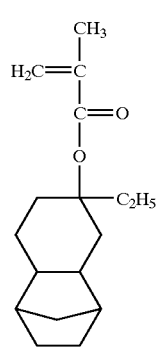 (iii-50)

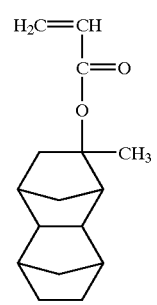 (iii-51)
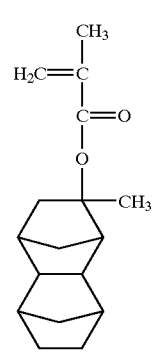 (iii-52)
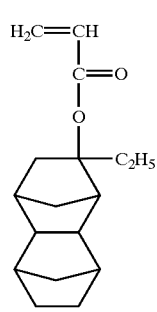 (iii-53)
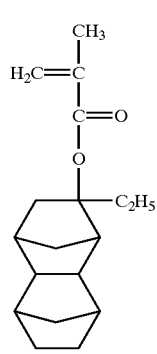 (iii-54)
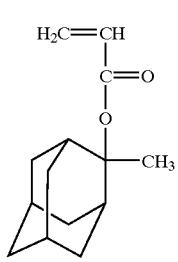 (iii-55)
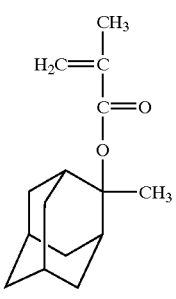 (iii-56)
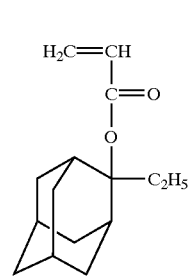 (iii-57)
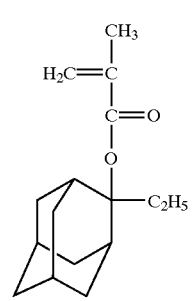 (iii-58)
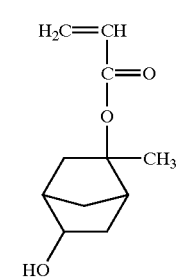 (iii-59)
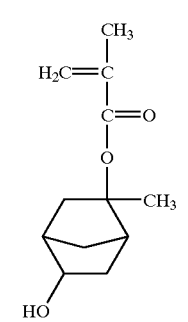 (iii-60)

-continued
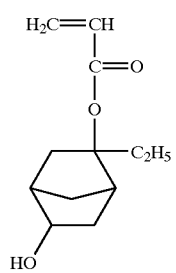 (iii-61)
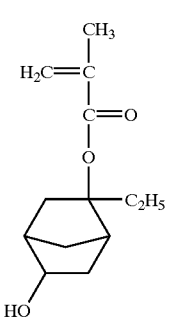 (iii-62)
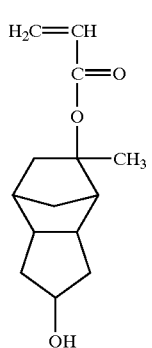 (iii-63)
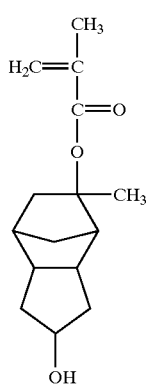 (iii-64)
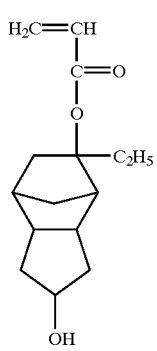 (iii-65)
-continued
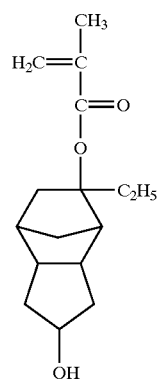 (iii-66)
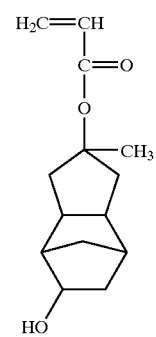 (iii-67)
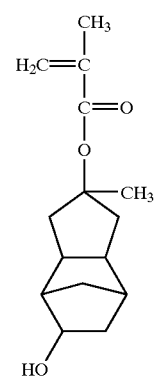 (iii-68)
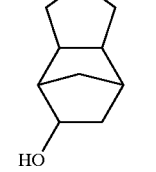 (iii-69)

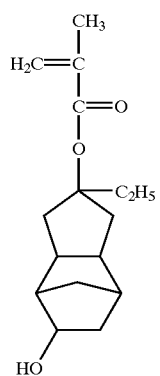 (iii-70)
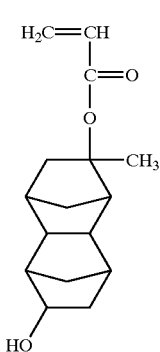 (iii-71)
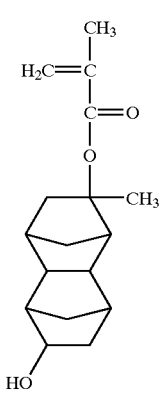 (iii-72)
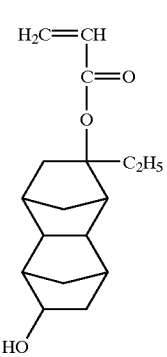 (iii-73)
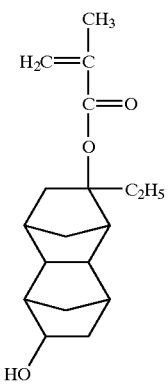 (iii-74)
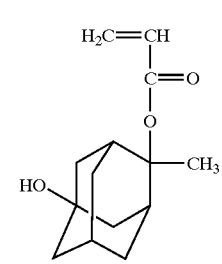 (iii-75)
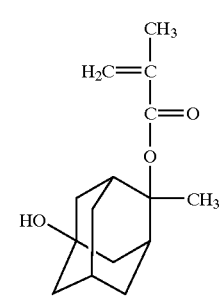 (iii-76)
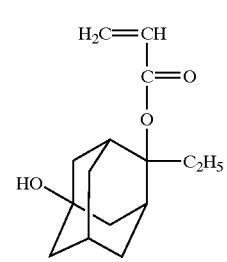 (iii-77)
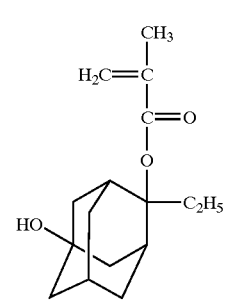 (iii-78)

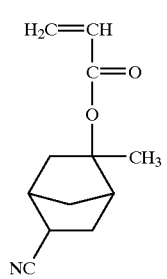 (iii-79)
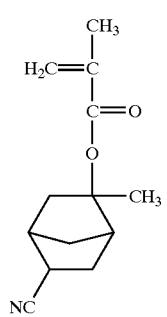 (iii-80)
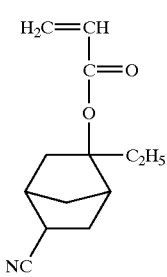 (iii-81)
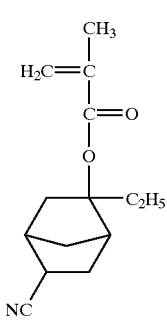 (iii-82)
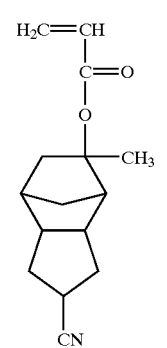 (iii-83)
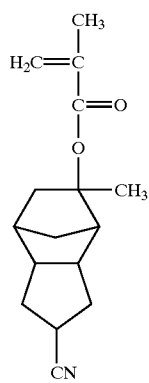 (iii-84)
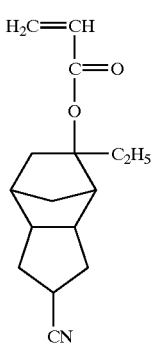 (iii-85)
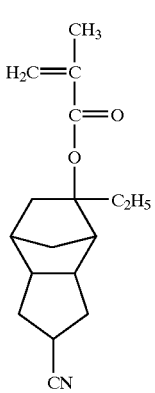 (iii-86)
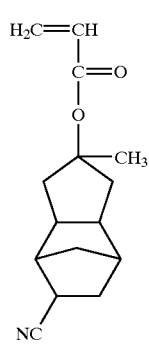 (iii-87)

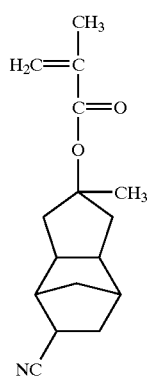
(iii-88)
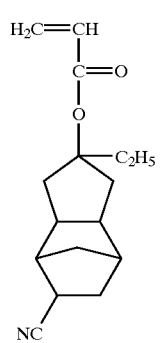
(iii-89)
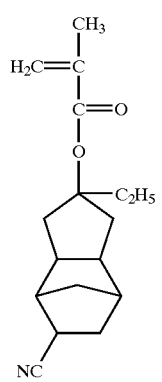
(iii-90)
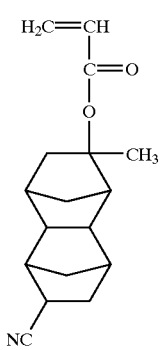
(iii-91)
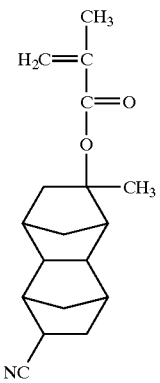
(iii-92)
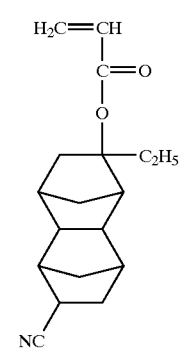
(iii-93)
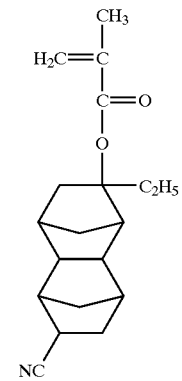
(iii-94)
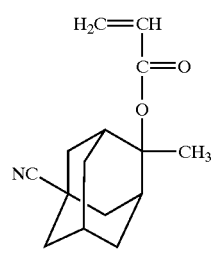
(iii-95)
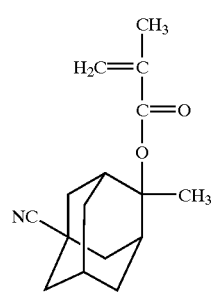
(iii-96)

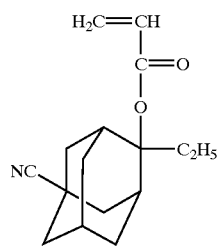
(iii-97)

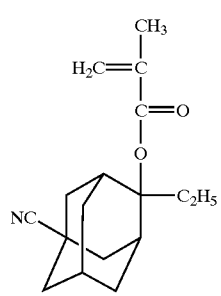
(iii-98)

Among the (meth)acrylic acid derivatives (III-1) shown by the above formulas (iii-1) to (iii-98), compounds shown by the formulas
(iii-1), (iii-2), (iii-7), (iii-8), (iii-9), (iii-10), (iii-11), (iii-12), (iii-13), (iii-14), (iii-17), (iii-18), (iii-19), (iii-20),(iii-21), (iii-22),(iii-23),(iii-24),(iii-27),(iii-28),(iii-29),(iii-30), (iii-31),(iii-32),(iii-35),(iii-36),(iii-43), (iii-44) ,(iii-47) ,(iii-48) ,(iii-55) (iii-56) ,(iii-57) ,(iii-58),(iii-59),(iii-60), (iii-71),(iii-72),(iii-75),(iii-76) ,(iii-79),(iii-80),(iii-91), (iii-92),(iii-95),(iii-96), and the like are particularly preferable.

The (meth)acrylic acid derivatives (III-1) may be included in the resins (A1) and (A2) either individually or in combination of two or more.

As examples of a divalent hydrocarbon group having an alicyclic skeleton containing 3–15 carbon atoms for $R^4$ in the (meth) acrylic acid derivatives (III-2), alicyclic hydrocarbon groups derived from norbornane, tricyclodecane, tetracyclododecane, adamantane, or cycloalkanes such as cyclobutane, cyclopentane, cyclohexane, cycloheptane, and cyclooctane; the above alicyclic hydrocarbon groups substituted by at least one of linear, branched, or cyclic alkyl groups having 2–8 carbon atoms such as a methyl group, ethyl group, n-propyl group, i-propyl group, n-butyl group, 2-methylpropyl group, 1-methylpropyl group, and t-butyl group; and the like can be given.

Of these alicyclic hydrocarbon groups, alicyclic hydrocarbon groups derived from norbornane, tricyclodecane, tetracyclododecane, or adamantane, the above alicyclic hydrocarbon groups substituted by the above alkyl groups, and the like are preferable.

As preferable examples of $R^4$, compounds shown by the following formulas (6) to (20) and the like can be given. Note that either one of the two bonding hands (–) of these groups may be bonded to a t-butoxycarbonyl group.

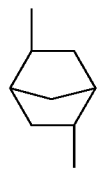
(6)

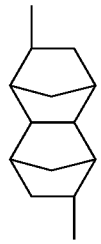
(7)

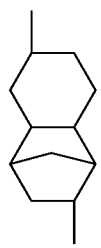
(8)

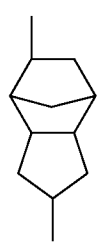
(9)

(10)

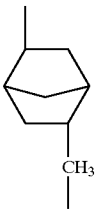
(11)

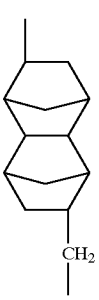
(12)

(13) 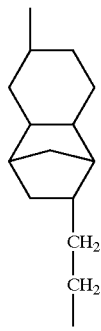

(14) 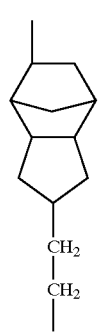

(15) 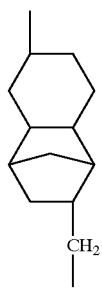

(16)

(17) 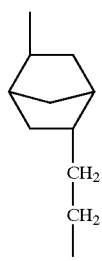

(18) 

(19) 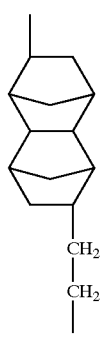

(20)

Of these groups, groups shown by the formulas (6), (7), (10), (11), (12), and (15) are particularly preferable.

The resins (A1) and (A2) may further comprise one or more recurring units derived from other polymerizable unsaturated monomers (hereinafter called "other monomers ((α)").

Examples of such other monomers (α) include:
bicyclo[2.2.1]hept-2-ene, 5-methylbicyclo[2.2.1]hept-2-ene,
5-ethylbicyclo[2.2.1]hept-2-ene,
tetracyclo[4.4.0.1$^{2,5}$.1$^{7,10}$]dodec-3-ene,
8-methyltetracyclo[4.4.0.1$^{2,5}$.1$^{7,10}$]dodec-3-ene,
8-ethyltetracyclo[4.4.0.1$^{2,5}$.1$^{7,10}$]dodec-3-ene,
8-fluorotetracyclo[4.4.0.1$^{2,5}$.1$^{7,10}$]dodec-3-ene,
8-fluoromethyltetracyclo[4.4.0.1$^{2,5}$.1$^{7,10}$]dodec-3-ene,
8-difluoromethyltetracyclo[4.4.0.1$^{2,5}$.1$^{7,10}$]dodec-3-ene,
8-trifluoromethyltetracyclo[4.4.0.1$^{2,5}$.1$^{7,10}$]dodec-3-ene,
8-pentafluoroethyltetracyclo[4.4.0.1$^{2,5}$.1$^{7,10}$]dodec-3-ene,
8,8-difluorotetracyclo[4.4.0.1$^{2,5}$.1$^{7,10}$]dodec-3-ene,
8,9-difluorotetracyclo[4.4.0.1$^{2,5}$.1$^{7,10}$]dodec-3-ene,
8,8-bis(trifluoromethyl)tetracyclo[4.4.0.1$^{2,5}$.1$^{7,10}$]dodec-3-ene, 8,9-bis(trifluoromethyl)tetracyclo[4.4.0.1$^{2,5}$.1$^{7,10}$]dodec-3-ene,
8-methyl-8-trifluoromethyltetracyclo[4.4.0.1$^{2,5}$.1$^{7,10}$]dodec-3-ene, 8,8,9-trifluorotetracyclo[4.4.0.1$^{2,5}$.1$^{7,10}$]dodec-3-ene,
8,8,9-tris(trifluoromethyl)tetracyclo[4.4.0.1$^{2,5}$.1$^{7,10}$]dodec-3-ene,
8,8,9,9-tetrafluorotetracyclo[4.4.0.1$^{2,5}$.1$^{7,10}$]dodec-3-ene,
8,8,9,9-tetrakis(trifluoromethyl)tetracyclo[4.4.0.1$^{2,5}$.1$^{7,10}$]dodec-3-ene,
8,8-difluoro-9,9-bis(trifluoromethyl)tetracyclo[4.4.0.1$^{2,5}$.1$^{7,10}$]dodec-3-ene,
8,9-difluoro-8,9-bis(trifluoromethyl)tetracyclo[4.4.0.12,5.17,10]dodec-3-ene,
8,8,9-trifluoro-9-trifluoromethyltetracyclo[4.4.0.1$^{2,5}$.1$^{7,10}$]dodec-3-ene,
8,8,9-trifluoro-9-trifluoromethoxytetracyclo[4.4.0.1$^{2,5}$.1$^{7,10}$]dodec-3-ene,
8,8,9-trifluoro-9-pentafluoro-n-propoxytetracyclo[4.4.0.1$^{2,5}$.1$^{7,10}$]dodec-3-ene,
8-fluoro-8-pentafluoroethyl-9,9-bis(trifluoromethyl)tetracyclo[4.4.0.1$^{2,5}$.1$^{7,10}$]dodec-3-ene,
8,9-difluoro-8-heptafluoro-i-propyl-9-trifluoromethyltetracyclo[4.4.0.1$^{2,5}$.1$^{7,10}$]dodec-3-ene,
8-chloro-8,9,9-trifluorotetracyclo[4.4.0.1$^{2,5}$.1$^{7,10}$]dodec-3-ene,
8,9-dichloro-8,9-bis(trifluoromethyl)tetracyclo[4.4.0.1$^{2,5}$.1$^{7,10}$]dodec-3-ene,
8-(2', 2', 2'-trifluorocarboethoxy)tetracyclo[4.4.0.1$^{2,5}$.1$^{7,10}$]dodec-3-ene,
8-methyl-8-(2', 2', 2'-trifluorocarboethoxy)tetracyclo[4.4.0.1$^{2,5}$.1$^{7,10}$]dodec-3-ene,
dicyclopentadiene, tricyclo[5.2.1.0$^{2,6}$]dec-8-ene,
tricyclo[5.2.1.0$^{2,6}$]dec-3-ene,
tricyclo[4.4.0.1$^{2,5}$]undec-3-ene,
tricyclo[6.2.1.0$^{1,8}$]undec-9-ene,
tricyclo[6.2.1.0$^{1,8}$]undec-4-ene,
tetracyclo[4.4.0.1$^{2,5}$.1$^{7,10}$.0$^{1,6}$]dodec-3-ene,
8-methyltetracyclo[4.4.0.1$^{2,5}$.1$^{7,10}$0$^{1,6}$]dodec-3-ene,
8-ethylidenetetracyclo[4.4.0.1$^{2,5}$.1$^{7,12}$]dodec-3-ene,
8-ethylidenetetracyclo[4.4.0.1$^{2,5}$.1$^{7,10}$.0$^{1,6}$]dodec-3-ene,
pentacyclo[6.5.1.1$^{3,6}$.0$^{2,7}$.0$^{2,7}$.0$^{9,13}$]pentadec-4-ene,
pentacyclo[7.4.0.1$^{2,5}$.1$^{9,12}$.0$^{8,13}$]pentadec-3-ene;
monofunctional monomers such as (meth)acrylates such as norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate, 1-methyladamantyl (meth) acrylate, methyl (meth)acrylate, ethyl (meth)acrylate, n-propyl (meth)acrylate, n-butyl (meth)acrylate, 2-hydroxyethyl (meth)acrylate, 2-hydroxypropyl (meth)acrylate, 3-hydroxypropyl (meth)acrylate, cyclopropyl (meth)acrylate, cyclopentyl (meth)acrylate, cyclohexyl (meth)acrylate, cyclohexenyl (meth)acrylate, 4-methoxycyclohexyl (meth)acrylate, 2-cyclopropyl oxycarbonylethyl (meth) acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, and 2-(4'-methoxycyclohexyl)oxycarbonylethyl (meth) acrylate; α-hydroxymethyl acrylates such as methyl α-hydroxymethyl acrylate, ethyl α-hydroxymethyl acrylate, n-propyl α-hydroxymethyl acrylate, and n-butyl α-hydroxymethyl acrylate; vinyl esters such as vinyl acetate, vinyl propionate, and vinyl butyrate; unsaturated nitryl compounds such as (meth)acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl (meth) acrylamide, crotonamide, maleinamide, fumaramide, mesaconamide, citraconamide, and itaconamide; other nitrogen-containing vinyl compounds such as N-vinyl-ε-caprolactam, N-vinylpyrrolidone, 2-vinylpyridine, 3-vinylpyridine, 4-vinylpyridine, and N-vinylimidazole; unsaturated carboxylic acids such as (meth)acrylic acid, crotonic acid, maleic acid, fumaric acid, itaconic acid, citraconic acid, and mesaconic acid; carboxyl group-containing esters of unsaturated carboxylic acids such as 2-carboxyethyl (meth)acrylate, 2-carboxypropyl (meth)acrylate, 3-carboxypropyl (meth)acrylate, 4-carboxybutyl (meth)acrylate, 4-carboxycyclohexyl (meth)acrylate, carboxytricyclodecanyl (meth) acrylate, and carboxytetracyclodecanyl (meth) acrylate; and compounds in which a carboxyl group in the above unsaturated carboxylic acids or carboxyl group-containing esters of unsaturated carboxylic acids is converted into an acid-dissociable organic group (ii), as described later (hereinafter called "other acid-dessociable group-containing monomers") ; and polyfunctional monomers such as methylene glycol di (meth) acrylate, ethylene glycol di (meth) acrylate, propylene glycol di(meth)acrylate, 1, 6-hexanediol di (meth) acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, 1,3-bis(2-hydroxypropyl)benzene di(meth)acrylate, 1,2-adamantanediol di(meth)acrylate, 1,3-adamantanediol di(meth)acrylate, 1,4-adamantanediol di(meth)acrylate, and tricyclodecanyldimethylol di(meth)acrylate.

As examples of the acid-dissociable organic group (ii), groups in which a hydrogen atom of a carboxyl group is replaced by a substituted methyl group, 1-substituted ethyl group, 1-branched alkyl group, silyl group, germyl group, alkoxycarbonyl group, acyl group, cyclic acid-dissociable group (excluding the case where the compound in which a hydrogen atom of a carboxyl group in a (meth) acrylic acid is replaced by the cyclic acid-dissociable group is the (meth)acrylic acid derivative (III)), and the like can be given.

As examples of a substituted methyl group, a methoxymethyl group, methylthiomethyl group, ethoxymethyl group, ethylthiomethyl group, 2-methoxyethoxymethyl group, benzyloxymethyl group, benzylthiomethyl group, phenacylgroup, 4-bromophenacyl group, 4-methoxyphenacyl group, 4-methylthiophenacyl group, α-methylphenacyl group, cyclopropylmethyl group, benzyl group, diphenylmethyl group, triphenylmethyl group, 4-bromobenzyl group, 4-nitrobenzyl group, 4-methoxybenzyl group, 4-methylthiobenzyl group, 4-ethoxybenzyl group, 4-ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of a 1-substituted methyl group, a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, 1-t-butoxycarbonylethyl group, and the like can be given.

As examples of a 1-branched alkyl group, an i-propyl group, 1-methylpropyl group, t-butyl group, 1,1-dimethylpropyl group, 1-methylbutyl group, 1,1-dimethylbutyl group, and the like can be given.

As examples of a silyl group, a trimethylsilyl group, ethyldimethylsilyl group, methyldiethylsilyl group, triethylsilyl group, i-propyldimethylsilyl group, methyldi-i-propyl silyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like can be given.

As examples of a germyl group, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of an alkoxycarbonyl group, a methoxycarbonyl group, ethoxycarbonyl group, i-propoxycarbonyl group, t-butoxycarbonyl group, and the like can be given.

As examples of an acyl group, an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, scucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of a cyclic acid-dissociable group, an 3-oxocyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 2-oxo-4-methyltetrahydropyranyl group, 4-methoxytetrahydrothiopyranyl group, 3-tetrahydrothiophene-1,1-dioxide group, and the like can be given.

The content of the recurring unit (I) in the resin (A1) is usually 20–70 mol %, preferably 20–60 mol %, and still more preferably 25–60 mol % of the total amount of the recurring units. The content of the recurring unit (II) in the resin (A1) is usually 5–70 mol %, preferably 10–50 mol %, and still more preferably 10–45 mol % of the total amount of the recurring units. The content of the recurring unit (III-1) or the recurring unit (III-2), or both, in the resin (A1) is usually 5–70 mol %, preferably 10–50 mol %, and still more preferably 10–45 mol % of the total amount of the recurring units.

If the content of the recurring unit (I) is less than 20 mol %, dry etching resistance as a resist tends to decrease. If the content exceeds 70 mol %, developability and adhesion to substrates as a resist tend to decrease. If the content of the recurring unit (II) is less than 5 mol %, adhesion to substrates as a resist tends to decrease. If the content exceeds 70 mol %, dry etching resistance as a resist tends to decrease. If the content of the recurring unit (III-1) or recurring unit (III-2), or both, is less than 5 mol %, resolution and dry etching resistance as a resist tend to decrease. If the content exceeds 70 mol %, developability and heat resistance as a resist tend to decrease.

The content of the recurring units derived from other monomers (α) is usually 10 mol % or less, preferably 8 mol % or less, and still more preferably 5 mol % or less.

The content of the recurring unit (I-1) in the resin (A2) is usually 10–60 mol %, preferably 10–50 mol %, and still more preferably 10–45 mol % of the total amount of the recurring units. If the content of the recurring unit (I-1) is less than 10 mol %, resolution as a resist tends to decrease. If the content exceeds 60 mol %, the resulting resist film may repel a developer, thereby decreasing developability.

The content of the recurring unit (I-2) in the resin (A2) is usually 10–60 mol %, preferably 10–50 mol %, and still more preferably 10–45 mol % of the total amount of the recurring units. If the content of the recurring unit (I-2) is less than 10 mol %, the resulting resist film may repel a developer, thereby decreasing developability. If the content exceeds 60 mol %, the resulting resist film may swell due to a developer.

The content of the recurring unit (II) in the resin (A2) is usually 10–50 mol %, preferably 15–45 mol %, and still more preferably 15–40 mol % of the total amount of the recurring units. If the content of the recurring unit (II) is less than 10 mol %, adhesion to substrates of the resulting resist film tends to decrease. If the content exceeds 50 mol %, the resulting resist film may exhibit insufficient radiation transmittance, thereby impairing the pattern shape.

The content of the recurring unit (III-1) or recurring unit (III-1), or both, in the resin (A2) is usually 10–50 mol %, preferably 10–45 mol %, and still more preferably 15–45 mol % of the total amount of the recurring units. If the content is less than 10 mol %, resolution as a resist tends to decrease. If the content exceeds 50 mol %, dry etching resistance as a resist tends to decrease.

The content of other recurring units is usually 10 mol % or less, and preferably 5 mol % or less.

The resin (A1) is prepared by copolymerizing the norbornene derivatives (I), maleic anhydride, and (meth)acrylic acid derivatives (III-1) and/or (meth)acrylic acid derivatives (III-2) together with other monomers (α), as required, in an appropriate solvent using a radical polymerization initiator such as hydroperoxides, dialkyl peroxides, diacyl peroxides, or azo compounds. The resin (A2) is prepared by copolymerizing the norbornene derivatives (I-1), norbornene derivatives (I-2), maleic anhydride, and at least one of (meth)acrylic acid derivatives (III-1) and (meth)acrylic acid derivatives (III-2) together with other monomers (α), as required, in an appropriate solvent using a radical polymerization initiator such as hydroperoxides, dialkyl peroxides, diacyl peroxides, or azo compounds.

Given as examples of the solvent used for copolymerizing the components are alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and ethyl propionate; ethers such as tetrahydrofuran, dimethoxyethanes, and diethoxyethanes; and the like.

These solvents may be used either individually or in combination of two or more.

The copolymerization is carried out at a temperature of usually 40–120° C., and preferably 50–90° C. for 1–48 hours, and preferably 1–24 hours.

The polystyrene-reduced weight average molecular weight (hereinafter referred to as "Mn") of the resin (A1) and the resin (A2) determined by gel permeation chromatography (GPC) is usually 3,000–300,000, preferably 4,000–200,000, and still more preferably 4,000–100,000. If Mw of the resin (A) is less than 3,000, heat resistance as a resist tends to decrease. If Mw exceeds 300,000, developability as a resist tends to decrease.

It is preferable that the resin (A1) and the resin (A2) contain almost no impurities such as halogens or metals. The smaller the amount of such impurities, the better the sensitivity, resolution, process stability, pattern shape, and the like as a resist. The resin (A1) and the resin (A2) are purified using, for example, a chemical purification method such as washing with water or liquid-liquid extraction or a combination of the chemical purification method and a physical purification method such as ultrafiltration or centrifugation.

In the present invention, either one type of the resin (A1) or resin (A2) or a combination of two or more different types of resins arbitrary selected from a number of the resins (A1) and (A2) can be used.

Component (B)

The component (B) of the present invention is a photoacid generator which generates an acid upon exposure (hereinafter called "acid generator (B)"). The acid generator (B) causes an acid-dissociable group in the resin (A) to dissociate by the action of an acid generated upon exposure. As a result, an exposed part of the resist film becomes readily soluble in an alkaline developer, thereby forming a positive-tone resist pattern.

As examples of the acid generator (B), onium salts, halogen-containing compounds, diazoketone compounds, sulfone compounds, sulfonate compounds, and the like can be given.

Examples of the acid generator (B) are given below.

Onium Salts

As examples of onium salts, iodonium salts, sulfonium salts (including tetrahydrothiophenium salts), phosphonium salts, diazonium salts, pyridinium salts, and the like can be given.

Specific examples of preferable onium salts include:
diphenyliodonium trifluoromethanesulfonate, diphenyliodonium nonafluoro-n-butanesulfonate, diphenyliodonium perfluoro-n-octanesulfonate, diphenyliodonium pyrenesulfonate, diphenyliodonium n-dodecylbenzenesulfonate, diphenyliodonium hexafluoroantimonate, diphenyliodonium naphthalenesulfonate, diphenyliodonium 10-camphorsulfonate,
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
1-(4-methoxyphenyl)tetrahydrothiophenium trifluoromethanesulfonate,
1-(4-methoxyphenyl)tetrahydrothiophenium nonafluoro-n-butanesulfonate,
1-(4-methoxyphenyl)tetrahydrothiophenium perfluoro-n-octanesulfonate,
1-(2,4-dimethoxyphenyl)tetrahydrothiophenium trifluoromethanesulfonate,
1-(2,4-dimethoxyphenyl)tetrahydrothiophenium nonafluoro-n-butanesulfonate,
1-(2,4-dimethoxyphenyl)tetrahydrothiophenium perfluoro-n-octanesulfonate,
bis(4-t-butylphenyl)iodonium trifluoromethanesulfonate,
bis(4-t-butylphenyl)Iodonium nonafluoro-n-butanesulfonate,
bis(4-t-butylphenyl)iodonium perfluoro-n-octanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium hexafluoroantimonate,
bis(4-t-butylphenyl)iodonium naphthalenesulfonate,
bis(4-t-butylphenyl)iodonium 10-camphorsulfonate,
triphenylsulfonium trifluoromethanesulfonate,
triphenylsulfonium nonafluoro-n-butanesulfonate,
triphenylsulfonium perfluoro-n-octanesulfonate,
triphenylsulfonium pyrenesulfonate,
triphenylsulfonium n-dodecylbenzenesulfonate,
triphenylsulfonium hexafluoroantimonate,
triphenylsulfonium naphthalenesulfonate,
triphenylsulfonium 10-camphorsulfonate,
cyclohexyl.2-oxocyclohexyl.methylsulfonium trifluoromethanesulfonate,
cyclohexyl.2-oxocyclohexyl.methylsulfonium nonafluoro-n-butanesulfonate,
cyclohexyl.2-oxocyclohexyl.methylsulfonium perfluoro-n-octanesulfonate,
dicyclohexyl.2-oxocyclohexylsulfonium trifluoromethanesulfonate,
dicyclohexyl.2-oxocyclohexylsulfonium nonafluoro-n-butanesulfonate,
dicyclohexyl.2-oxocyclohexylsulfonium perfluoro-n-octanesulfonate,
2-oxocyclohexyldimethylsulfonium trifluoromethanesulfonate,
2-oxocyclohexyldimethylsulfonium nonafluoro-n-butanesulfonate,
2-oxocyclohexyldimethylsulfonium perfluoro-n-octanesulfonate,
4-hydroxyphenyl.phenyl.methylsulfonium p-toluenesulfonate,
4-hydroxyphenyl.benzyl.methylsulfonium p-toluenesulfonate,
1-naphthyldimethylsulfonium trifluoromethanesulfonate,
1-naphthyldimethylsulfonium nonafluoro-n-butanesulfonate,
1-naphthyldimethylsulfonium perfluoro-n-octanesulfonate,
1-naphthyldiethylsulfonium trifluoromethanesulfonate,
1-naphthyldiethylsulfonium nonafluoro-n-butanesulfonate,
1-naphthyldiethylsulfonium perfluoro-n-octanesulfonate,
4-cyano-1-naphthyldimethylsulfonium trifluoromethanesulfonate,
4-cyano-1-naphthyldimethylsulfonium nonafluoro-n-butanesulfonate,
4-cyano-1-naphthyldimethylsulfonium perfluoro-n-octanesulfonate,
4-nitro-1-naphthyldimethylsulfonium trifluoromethanesulfonate,
4-nitro-1-naphthyldimethylsulfonium nonafluoro-n-butanesulfonate,
4-nitro-1-naphthyldimethylsulfonium perfluoro-n-octanesulfonate,
4-methyl-1-naphthyldimethylsulfonium trifluoromethanesulfonate,
4-methyl-1-naphthyldimethylsulfonium nonafluoro-n-butanesulfonate, 4-methyl-1-naphthyldimethylsulfonium perfluoro-n-octanesulfonate,
4-hydroxy-1-naphthyldimethylsulfonium trifluoromethanesulfonate,
4-hydroxy-1-naphthyldimethylsulfonium nonafluoro-n-butanesulfonate,
4-hydroxy-1-naphthyldimethylsulfonium perfluoro-n-octanesulfonate,
4-cyano-1-naphthyldiethylsulfonium trifluoromethanesulfonate,
4-cyano-1-naphthyldiethylsulfonium nonafluoro-n-butanesulfonate,
4-cyano-1-naphthyldiethylsulfonium perfluoro-n-octanesulfonate,
4-nitro-1-naphthyldiethylsulfonium trifluoromethanesulfonate,
4-nitro-1-naphthyldiethylsulfonium nonafluoro-n-butanesulfonate,
4-nitro-1-naphthyldiethylsulfonium perfluoro-n-octanesulfonate,
4-methyl-1-naphthyldiethylsulfonium trifluoromethanesulfonate,
4-methyl-1-naphthyldiethylsulfonium nonafluoro-n-butanesulfonate,
4-methyl-1-naphthyldiethylsulfonium perfluoro-n-octanesulfonate,
4-hydroxy-1-naphthyldiethylsulfonium trifluoromethanesulfonate,
4-hydroxy-1-naphthyldiethylsulfonium nonafluoro-n-butanesulfonate,
4-hydroxy-1-naphthyldiethylsulfonium perfluoro-n-octanesulfonate,
4-hydroxy-1-naphthyltetrahydrothiophenium trifluoromethanesulfonate,
4-methoxy-1-naphthyltetrahydrothiophenium trifluoromethanesulfonate,
4-ethoxy-1-naphthyltetrahydrothiophenium trifluoromethanesulfonate,
4-n-propoxy-1-naphthyltetrahydrothiophenium trifluoromethanesulfonate,
4-i-propoxy-1-naphthyltetrahydrothiophenium trifluoromethanesulfonate,
4-n-butoxy-1-naphthyltetrahydrothiophenium trifluoromethanesulfonate,
4-t-butoxy-1-naphthyltetrahydrothiophenium trifluoromethanesulfonate,
4-hydroxy-1-naphthyltetrahydrothiopheniumn nonafluoro-n-butanesulfonate,
4-hydroxy-1-naphthyltetrahydrothiophenium perfluoro-n-octanesulfonate,
4-methoxy-1-naphthyltetrahydrothiophenium nonafluoro-n-butanesulfonate,
4-methoxy-1-naphthyltetrahydrothiophenium perfluoro-n-octanesulfonate,
4-ethoxy-1-naphthyltetrahydrothiophenium nonafluoro-n-butanesulfonate,
4-ethoxy-1-naphthyltetrahydrothiophenium perfluoro-n-octanesulfonate,
4-n-propoxy-1-naphthyltetrahydrothiophenium nonafluoron-n-butanesulfonate,
4-n-propoxy-1-naphthyltetrahydrothiophenium perfluoro-n-octanesulfonate,
4-i-propoxy-1-naphthyltetrahydrothiophenium nonafluoro-n-butanesulfonate,
4-i-propoxy-1-naphthyltetrahydrothiophenium perfluoro-n-octanesulfonate,
4-n-butoxy-1-naphthyltetrahydrothiophenium nonafluoro-n-butanesulfonate,
4-n-butoxy-1-naphthyltetrahydrothiophenium perfluoro-n-octanesulfonate,
4-t-butoxy-1-naphthyltetrahydrothiophenium nonafluoro-n-butanesulfonate,
4-t-butoxy-1-naphthyltetrahydrothiophenium perfluoro-n-octanesulfonate,
4-methoxymethoxy-1-naphthyltetrahydrothiophenium trifluoromethanesulfonate,
4-methoxymethoxy-1-naphthyltetrahydrothiophenium nonafluoro-n-butanesulfonate,
4-methoxymethoxy-1-naphthyltetrahydrothiophenium perfluoro-n-octanesulfonate,
4-ethoxyethoxy-1-naphthyltetrahydrothiophenium trifluoromethanesulfonate,
4-ethoxyethoxy-1-naphthyltetrahydrothiophenium nonafluoro-n-butanesulfonate,
4-ethoxyethoxy-1-naphthyltetrahydrothiophenium perfluoro-n-octanesulfonate,
4-(1'-methoxyethoxy)-1-naphthyltetrahydrothiophenium trifluoromethanesulfonate,
4-(1'-methoxyethoxy)-1-naphthyltetrahydrothiophenium nonafluoro-n-butanesulfonate,
4-(1'-methoxyethoxy)-1-naphthyltetrahydrothiophenium perfluoro-n-octanesulfonate,
4-(2'-methoxyethoxy)-1-naphthyltetrahydrothiophenium trifluoromethanesulfonate,
4-(2'-methoxyethoxy)-1-naphthyltetrahydrothiophenium nonafluoro-n-butanesulfonate,
4-(2'-methoxyethoxy)-1-naphthyltetrahydrothiophenium perfluoro-n-octanesulfonate,
4-methoxycarbonyloxy-1-naphthyltetrahydrothiophenium trifluoromethanesulfonate,
4-methoxycarbonyloxy-1-naphthyltetrahydrothiophenium nonafluoro-n-butanesulfonate,
4-methoxycarbonyloxy-1-naphthyltetrahydrothiophenium perfluoro-n-octanesulfonate,
4-ethoxycarbonyloxy-1-naphthyltetrahydrothiophenium trifluoromethanesulfonate,
4-ethoxycarbonyloxy-1-naphthyltetrahydrothiophenium nonafluoro-n-butanesulfonate,
4-ethoxycarbonyloxy-1-naphthyltetrahydrothiophenium perfluoro-n-octanesulfonate,
4-n-propoxycarbonyloxy-1-naphthyltetrahydrothiophenium trifluoromethanesulfonate,
4-n-propoxycarbonyloxy-1-naphthyltetrahydrothiophenium nonafluoro-n-butanesulfonate,
4-n-propoxycarbonyloxy-1-naphthyltetrahydrothiophenium perfluoro-n-octanesulfonate,
4-i-propoxycarbonyloxy-1-naphthyltetrahydrothiophenium trifluoromethanesulfonate,
4-i-propoxycarbonyloxy-1-naphthyltetrahydrothiophenium nonafluoro-n-butanesulfonate,
4-i-propoxycarbonyloxy-1-naphthyltetrahydrothiophenium perfluoro-n-octanesulfonate,
4-n-butoxycarbonyloxy-1-naphthyltetrahydrothiophenium trifluoromethanesulfonate,
4-n-butoxycarbonyloxy-1-naphthyltetrahydrothiophenium nonafluoro-n-butanesulfonate,
4-n-butoxycarbonyloxy-1-naphthyltetrahydrothiophenium perfluoro-n-octanesulfonate,
4-t-butoxycarbonyloxy-1-naphthyltetrahydrothiophenium trifluoromethanesulfonate,
4-t-butoxycarbonyloxy-1-naphthyltetrahydrothiophenium nonafluoro-n-butanesulfonate,
4-t-butoxycarbonyloxy-1-naphthyltetrahydrothiophenium perfluoro-n-octanesulfonate,
4-(2'-tetrahydrofuranyloxy)-1-naphthyltetrahydrothiophenium trifluoromethanesulfonate, 4-(2'-tetrahydrofuranyloxy)-1-naphthyltetrahydrothiophenium nonafluoro-n-butanesulfonate,
4-(2'-tetrahydrofuranyloxy)-1-naphthyltetrahydrothiophenium perfluoro-n-octanesulfonate,
4-(2'-tetrahydropyranyloxy)-1-naphthyltetrahydrothiophenium trifluoromethanesulfonate,
4-(2'-tetrahydropyranyloxy)-1-naphthyltetrahydrothiophenium nonafluoro-n-butanesulfonate,
4-(2'-tetrahydropyranyloxy)-1-naphthyltetrahydrothiophenium perfluoro-n-octanesulfonate,
4-benzyloxy-1-naphthyltetrahydrothiophenium trifluoromethanesulfonate,
4-benzyloxy-1-naphthyltetrahydrothiophenium nonafluoro-n-butanesulfonate,
4-benzyloxy-1-naphthyltetrahydrothiophenium perfluoro-n-octanesulfonate,
1-(1'-naphthylacetomethyl)tetrahydrothiophenium trifluoromethanesulfonate,
1-(1'-naphthylacetomethyl)tetrahydrothiophenium nonafluoro-n-butanesulfonate,
1-(1'-naphthylacetomethyl)tetrahydrothiophenium perfluoro-n-octanesulfonate, and the like.

Halogen-containing Compounds

As examples of halogen-containing compounds, haloalkyl group-containing hydrocarbon compounds, haloalkyl group-containing heterocyclic compounds, and the like can be given.

As specific examples of preferable halogen-containing compounds, (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine, 1,1-bis(4'-chlorophenyl)-2,2,2-trichloroethane, and the like can be given.

Diazoketone Compounds

As examples of diazoketone compounds, 1,3-diketo-2-diazo compounds, diazobenzoquinone compounds, diazonaphthoquinone compounds, and the like can be given.

As specific examples of preferable diazoketone compounds, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris (4'-hydroxyphenyl)ethane, and the like can be given.

Sulfone Compounds

As examples of sulfone compounds, β-ketosulfone, β-sulfonylsulfone, α-diazo compounds of these compounds, and the like can be given.

As specific examples of preferable sulfone compounds, 4-trisphenacylsulfone, mesitylphenacylsulfone, bis(phenylsulfonyl)methane, and the like can be given. Sulfonate compounds:

As examples of sulfonate compounds, alkyl sulfonate, alkylimide sulfonate, haloalkyl sulfonate, aryl sulfonate, imino sulfonate, and the like can be given.

As specific examples of preferable sulfone compounds, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dic arbodiimide, perfluoro-n-octanesulfonylbicyclo[2.2.1]hept-5-ene-2,3-dicarbodiimide,
N-hydroxysuccinimidetrifluoromethanesulfonate,
N-hydroxysuccinimidenonafluoro-n-butanesulfonate,
N-hydroxysuccinimideperfluoro-n-octanesulfonate, 1,8-naphthalenedicarboxylic acid imide trifluoromethanesulfonate, and the like can be given.

Of these acid generators (B), the following compounds are particularly preferable:
diphenyliodonium trifluoromethanesulfonate,
diphenyliodonium nonafluoro-n-butanesulfonate,
diphenyliodonium perfluoro-n-octanesulfonate,
1-(3,5-dimethyl-4-hydroxyphenyl)tetrahydrothiophenium trifluoromethanesulfonate,
1-(3, 5dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
bis (4-t-butyl phenyl)iodonium trifluoromethanesulfonate,
bis(4-t-butylphenyl)iodonium nonafluoro-n-butanesulfonate,
bis(4-t-butylphenyl)iodonium perfluoro-n-octanesulfonate,
triphenylsulfonium trifluoromethanesulfonate,
triphenylsulfonium nonafluoro-n-butanesulfonate,
triphenylsulfonium perfluoro-n-octanesulfonate,
cyclohexyl.2-oxocyclohexyl.methylsulfonium trifluoromethanesulfonate,
cyclohexyl.2-oxocyclohexyl.methylsulfonium nonafluoro-n-butanesulfonate,
cyclohexyl.2-oxocyclohexyl.methylsulfonium perfluoro-n-octanesulfonate,
dicyclohexyl.2-oxocyclohexylsulfonium trifluoromethanesulfonate,
dicyclohexyl.2-oxocyclohexylsulfonium nonafluoro-n-butanesulfonate,
dicyclohexyl.2-oxocyclohexylsulfonium perfluoro-n-octanesulfonate,
2-oxocyclohexyldimethylsulfonium trifluoromethanesulfonate,
4-hydroxy-1-naphthyldimethylsulfonium trifluoromethanesulfonate,
4-hydroxy-1-naphthyltetrahydrothiophenium trifluoromethanesulfonate,
4-hydroxy-1-naphthyltetrahydrothiophenium nonafluoro-n-butanesulfonate,
4-hydroxy-1-naphthyltetrahydrothiophenium perfluoro-n-octanesulfonate,
1-(1'-naphthylacetomethyl)tetrahydrothiophenium trifluoromethanesulfonate,
1-(1'-naphthylacetomethyl)tetrahydrothiophenium nonafluoro-n-butanesulfonate,
1-(1'-naphthylacetomethyl)tetrahydrothiophenium perfluoro-n-octanesulfonate,
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
trifluoromethanesulfonylbicyclo[2.2.1]hept-5-ene-2,3-dicarbodiimide,
nonafluoro-n-butanesulfonylbicyclo[2.2.1]hept-5-ene-2,3-dic arbodiimide,
perfluoro-n-octanesulfonylbicyclo[2.2.1]hept-5-ene-2,3-dicarbodiimide,
N-hydroxysuccinimide trifluoromethanesulfonate,
N-hydroxysuccinimide nonafluoro-n-butanesulfonate, N-hydroxysuccinimide perfluoro-n-octanesulfonate, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octane sulfonate, and the like.

In the present invention, the acid generator (B) may be used either individually or in combination of two or more.

The amount of the acid generator (B) to be used in the present invention is usually 0.1–10 parts by weight, and preferably 0.5–7 parts by weight for 100 parts by weight of the resin (A1) or resin (A2) from the viewpoint of ensuring sensitivity and developability as a resist. If the amount of the acid generator (B) is less than 0.1 part by weight, sensitivity and developability as a resist tend to decrease. If the amount exceeds 10 parts by weight, a rectangular resist pattern may not be obtained due to decreased radiation transmittance.

Additives

It is preferable to add an acid diffusion controller to the radiation-sensitive resin composition of the present invention. The acid diffusion controller controls diffusion of an acid generated from the acid generator (B) upon exposure in the resist film to hinder undesired chemical reactions in the unexposed area.

The addition of such an acid diffusion controller improves storage stability of the resulting radiation-sensitive resin composition and resolution as a resist. Moreover, the addition of the acid diffusion controller prevents the line width of the resist pattern from changing due to changes in the post-exposure delay (PED) which is a period of time elapsed before development is initiated after exposure, whereby a composition with remarkably superior process stability can be obtained.

As the acid diffusion controller, organic compounds containing a nitrogen of which the basicity does not change during exposure or heating for forming a resist pattern are preferable.

As examples of such nitrogen-containing organic compounds, compounds shown by the following formula (21) (hereinafter called "nitrogen-containing compounds (a)"), compounds having two nitrogen atoms in the molecule (hereinafter called "nitrogen-containing compounds (b)"), polymers having at least three nitrogen atoms (hereinafter called "nitrogen-containing compounds (c)"), compounds containing an amide group, urea compounds, heterocyclic compounds containing a nitrogen atom, and the like can be given:

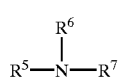

(21)

wherein $R^5$, $R^6$, and $R^7$ individually represent a hydrogen atom, a substituted or unsubstituted alkyl group, substituted or unsubstituted aryl group, or substituted or unsubstituted aralkyl group.

Examples of the nitrogen-containing compounds (a) include: mono(cyclo)alkylamines such as n-hexylamine, n-heptylamine, n-octylamine, n-nonylamine, n-decylamine, and cyclohexylamine; di (cyclo) alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine; and the like. Examples of the nitrogen-containing compounds (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4'-aminophenyl)propane, 2-(3'-aminophenyl)-2-(4'-aminophenyl)propane, 2-(4'-aminophenyl)-2-(3'-hydroxyphenyl)propane, 2-(4'-aminophenyl)-2-(4'-hydroxyphenyl)propane, 1,4-bis[1'-(4"-aminophenyl)-1'-methylethyl]benzene, 1,3-bis[1'-(4"-aminophenyl)-1'-methylethyl]benzene, and the like.

Examples of the nitrogen-containing compounds (c) include polyethyleneimine, polyallylamine, a polymer of 2-dimethylaminoethylacrylamide, and the like.

Examples of the amide group-containing compounds include N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone; and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include: imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2'-hydroxyethyl)piperazine; pyrazine, pyrazole, pyridazine, quinoxaline, purine, pyrrolidine, piperidine, morpholine, 4-methylmorpholine, 1,4-dimethylpiperazine, 1,4-diazabicyclo[2.2.2]octane; and the like.

Of these nitrogen-containing organic compounds, the nitrogen-containing organic compounds (a) and the nitrogen-containing heterocyclic compounds are preferable. Among the nitrogen-containing organic compounds (a), tri(cyclo)alkylamines are particularly preferable. Among the nitrogen-containing heterocyclic compounds, pyridines and piperazines are particularly preferable.

The acid diffusion controller may be used either individually or in combination of two or more.

The amount of the acid diffusion controller to be added is usually 15 parts by weight or less, preferably 10 parts by weight or less, and still more preferably 5 parts by weight or less for 100 parts by weight of the resin (A1) or resin (A2) If the amount of the acid diffusion controller exceeds 15 parts by weight, sensitivity as a resist and developability of the exposed area tend to decrease. If the amount is less than 0.001 part by weight, the pattern shape or dimensional accuracy as a resist may decrease depending on the processing conditions.

Alicyclic additives which further improve dry etching resistance, pattern shape, adhesion to substrate, and the like may be added to the radiation-sensitive resin composition of the present invention.

Examples of such alicyclic additives include: adamantane derivatives such as t-butyl 1-adamantanecarboxylate, t-butyl 3-adamantanecarboxylate, di-t-butyl 1,3-adamantanedicarboxylate, t-butyl 1-adamantaneacetate, t-butyl 3-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; and the like.

These alicyclic additives may be used either individually or in combination of two or more.

The amount of the alicyclic additives to be added is usually 50 parts by weight or less, and preferably 30 parts by weight or less for 100 parts by weight of the resin (A1) or resin (A2) If the amount of alicyclic additives exceeds 50 parts by weight, heat resistance as a resist tends to decrease.

Surfactants which improve applicability, developability, or the like may be added to the radiation-sensitive resin composition of the present invention.

As examples of surfactants, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, polyethylene glycol distearate; commercially available products such as KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by TOHKEM PRODUCTS CORPORATION), MEGAFAC F171, F173 (manufactured by Dainippon Ink and Chemicals, Inc.), Fluorard FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.); and the like can be given.

These surfactants may be used either individually or in combination of two or more.

The amount of surfactants to be added is usually 2 parts by weight or less for 100 parts by weight of the resin (resin (A1) or (A2)) and the acid generator (B) in total.

As other additives, halation inhibitors, adhesion promoters, storage stabilizers, anti-foaming agents, and the like can be given.

Preparation of Composition Solution

The radiation-sensitive resin composition of the present invention is prepared as a composition solution by dissolving the composition in a solvent so that the total solid content is 5–50 wt %, and preferably 10–25 wt %, and filtering the composition using a filter with a pore diameter of about 0.2 μm, for example.

Examples of solvents used for the preparation of the composition solution include: linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, -propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; n-propylalcohol, i-propylalcohol, n-butylalcohol, t-butylalcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol mono-methyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, butyl 3-methoxyacetate, butyl 3-methyl-3-methoxyacetate, butyl 3-methyl-3-methoxypropionate, butyl 3-methyl-3-methoxybutyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate; and the like.

These solvents may be used either individually or in combination of two or more. Among these solvents, linear or branched ketones, cyclic ketones, propylene glycol monoalkyl ether acetates, alkyl 2-hydroxypropionates, and alkyl 3-alkoxypropionates are preferable.

Formation of Resist Pattern

The radiation-sensitive resin composition of the present invention is particularly suitable for use as a chemically-amplified positive-tone resist.

In the chemically-amplified positive-tone resist, an acid-dissociable group in the resin (A) dissociates by the action of an acid generated from the acid generator (B) upon exposure. As a result, solublity of the exposed part of the resist in an alkaline developer increases, whereby the exposed part is dissolved in an alkaline developer and removed to obtain a positive-tone resist pattern.

A resist pattern is formed from the radiation-sensitive resin composition of the present invention by applying the composition solution to, for example, substrates such as a silicon wafer or a wafer coated with aluminum using an appropriate application method such as rotational coating, cast coating, and roll coating to form a resist film. The resist film is then optionally pre-baked (hereinafter called "PB") and exposed to form a predetermined resist pattern. As radiation used for exposure, deep ultraviolet rays, X-rays, electron beams, or the like is appropriately selected depending on types of the acid generator (B). It is particularly preferable to use an ArF excimer laser (wavelength: 193 nm) or KrF excimer laser (wavelength: 248 nm).

In the present invention, it is preferable to perform post-exposure bake (hereinafter called "PEB") after exposure. PEB ensures smooth dissociation of the acid-dissociable group in the resin (A). The heating temperature for PEB is usually 30–200° C., and preferably 50–170° C., although the heating conditions vary depending on the composition of the radiation-sensitive resin composition.

In order to bring out latent capability of the radiation-sensitive resin composition of the present invention, an organic or inorganic anti-reflection film may be formed on a substrate as disclosed in Japanese Patent Publication No. 12452/1994, for example. Moreover, a protection film may be formed on the resist film as disclosed in Japanese Patent Publication No. 188598/1993 or the like in order to prevent the effects of basic impurities or the like in an environmental atmosphere. These techniques may be employed in combination.

The exposed resist film is then developed to form a predetermined resist pattern.

As examples of a developer used for development, it is preferable to use an alkaline aqueous solution prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diaza bicyclo-[4.3.0]-5-nonene.

The concentration of the alkaline aqueous solution is usually 10 wt % or less. If the concentration of the alkaline aqueous solution exceeds 10 wt %, an unexposed area may be dissolved in the developer.

Organic solvents or the like may be added to the developer containing an alkaline aqueous solution.

As examples of organic solvents, ketones such as acetone, 2-butanone, 3-methyl-2-pentanone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually or in combination of two or more.

The amount of the organic solvents is preferably 100 vol % of the alkaline aqueous solution. If the amount of the organic solvents exceeds 100 vol %, an exposed area may remain undeveloped due to decreased developability.

In addition, surfactants or the like may be added to the developer containing the alkaline aqueous solution in an appropriate amount.

The resist film is generally washed with water after development using a developer containing an alkaline aqueous solution.

EXAMPLES

The embodiments of the present invention will be described in more detail by examples. However, these examples should not be construed as limiting the present invention. In the examples, part(s) and % respectively refer to part(s) by weight and wt % unless otherwise indicated.

Measurement and evaluation of each composition in the examples and comparative examples were carried out as follows.

Mw

Mw was measured by gel permeation chromatography (GPC) using GPC columns (manufactured by Tosoh Corp., G2000H$^{XL}$×2, G3000H$^{XL}$×1, G4000H$^{XL}$×1) under the following conditions. Flow rate: 1.0 ml/minute, eluate: tetrahydrofuran, column temperature: 40° C., standard reference material: monodispersed polystyrene.

Radiation Transmittance

A composition solution was applied to a quartz plate and the coating was post-baked on a hot plate at 90° C. for 60 seconds to obtain a resist film with a thickness of 1 $\mu$m. Radiation transmittance of the resist film was calculated from absorbance at a wavelength of 193 nm and was adopted as a standard for transparency in the deep UV ray region.

Relative Etching Rate

A composition solution was applied to a silicon wafer by spin coating and dried to form a resist film with a thickness of 0.5 $\mu$m. Then, the resist film was dry-etched using a Pinnacle 8000 (manufactured by PMT Co.) and with $CF_4$, $Cl_2$, and Ar as etching gases at a flow rate of 75 sccm and an output of 2,500 W under a gas pressure of 2.5 mTorr to measure the etching rate. The relative etching rate was calculated using the ratio of the found value to the etching rate of a cresol novolac resin film. The smaller the etching rate, the better the dry etching resistance.

Sensitivity

A silicon wafer (ARC) with a Deep UV30 film with a thickness of 520 Å (manufactured by Brewer Science) formed on the surface thereof and a silicon wafer (SiON) with a silicon oxynitride film formed on the surface so as to exhibit an anti-reflection effect at a wavelength of 193 nm were used as substrates. A composition solution was applied to each substrate and post-baked on a hot plate under the conditions shown in Table 2 to obtain resist films with a thickness of 0.4 $\mu$m and 0.2 $\mu$m. The films were exposed through a mask pattern using an ArF excimer laser exposure apparatus (manufactured by Nikon Corp., lens openings: 0.55, wavelength: 193 nm). After performing PEB under the conditions shown in Table 2, the resist films were developed in a 38% tetramethylammonium hydroxide aqueous solution (Examples) or 2.38×1/50% tetramethylammonium hydroxide aqueous solution (Comparative Example 1) at 25° C. for 1 minute, washed with water, and dried to form a positive-tone resist pattern. An optimum dose at which a line-and-space (1L1S) pattern with a line width of 0.18 $\mu$m was formed was taken as a standard of sensitivity.

Resolution

Minimum dimensions of the resist pattern resolved at the optimum dose was taken as a standard of resolution of the resist film.

Defective Development

Defective development was evaluated by observing the presence or absence of the defective development using an optical microscope and a KLA defect inspection device (manufactured by KLA-TENCOR JAPAN LTD.) by the following procedure. Evaluation procedure using KLA defect inspection device:

The total number of defective clusters and unclusters in one piece of wafer extracted from the difference produced by superposing reference images and pixels was counted by array mode observation using the KLA defect inspection device of which the sensitivity was set to detect defects with a size 0.15 μm or greater.

Pattern Shape

The dimensions of the lower side $L_1$ and the upper side $L_2$ of the rectangular cross-section of a line and space pattern (1L1S) with a line width of 0.20 μm were measured using a scanning electron microscope. A pattern shape which satisfied a formula "$0.85 \leq L_2/L_1 \leq 1$" and was straight was evaluated as "Good". A pattern shape which did not satisfy at least one of the above conditions was evaluated as "Bad".

Synthesis Example 1

A flask was charged with 66.6 g of 8-hydroxymethyltracyclo[$4.4.0.1^{2,5}.1^{7,10}$]dodec-3-ene, 34.3 g of maleic anhydride, 70.3 g of a methacrylic acid derivative (III-1) shown by the above formula (iii-48), 15 g of azobisisobutyronitrile, and 171 g of n-butyl acetate. The mixture was polymerized at 70° C. for 6 hours in a nitrogen atmosphere. After polymerization, the reaction solution was cooled to room temperature and poured into a large quantity of a i-propylalcohol/n-hexane mixed solution. A precipitated resin was filtered and washed with a small amount of n-hexane. The resin was then dried under vacuum to obtain a white resin with Mw of 8,500.

This resin was a copolymer of the recurring units (5–1), (5–2), and (5–3) shown by the following formulas in the proportions of 35 mol %, 35 mol %, and 30 mol %, respectively. This resin is referred to as a "resin (A1-1)".

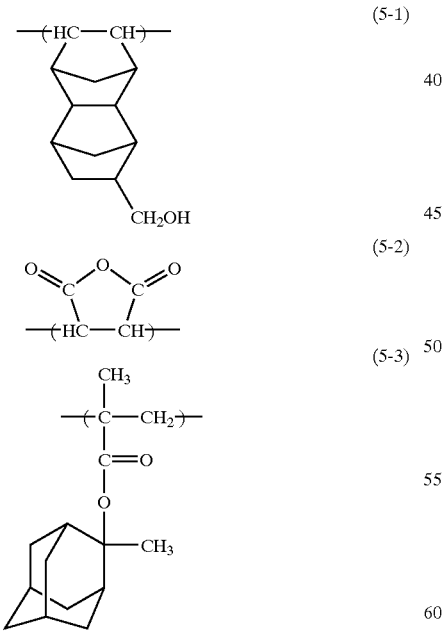

Synthesis Example 2

A white resin with Mw of 8,200 was obtained in the same manner as in the Synthesis Example 1 except for using 38.6 g of 5-hydroxybicyclo[2.2.1]hept-2-ene, 39.2 g of maleic anhydride, 49.7 g of a methacrylic acid derivative (III-1) shown by the above formula (iii-50), 13 g of 8-t-butoxycarbonyltetracyclo[$4.4.0.1^{2,5}.1^{7,10}$]dodec-3-ene, 15 g of azobisisobutyronitrile, and 211 g of n-butyl acetate as raw materials.

This resin was a copolymer of the recurring units (6-1), (6-2), (6-3), and (6-4) shown by the following formulas in the proportions of 35 mol %, 40 mol %, 20 mol %, and 5 mol %, respectively.

This resin is referred to as a "resin (A1-2)".

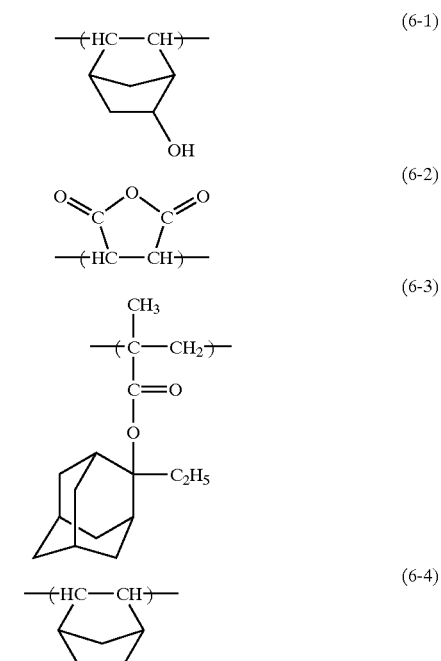

Synthesis Example 3

A white resin with Mw of 16,000 was obtained in the same manner as in the Synthesis Example 1 except for using 81.8 g of 8-hydroxymethyl-8-methyltetracyclo[$4.4.0.1^{2,5}.1^{7,10}$]dodec-3-ene, 39.2 g of maleic anhydride, 39.7 g of an acrylic acid derivative (III-1) shown by the above formula (iii-47), 5.1 g of 2,5-dimethyl-2,5-hexanediol diacrylate, 15 g of azobisisobutyronitrile, and 249 g of n-butyl acetate as raw materials.

This resin was a copolymer of the recurring units (7-1), (7-2), (7-3), and (7-4) shown by the following formulas in the proportions of 40 mol %, 40 mol %, 18 mol %, and 2 mol %, respectively. This resin is referred to as a "resin (A1-3)".

(7-1)
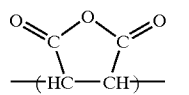

(7-2)
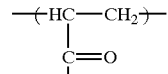

(7-3)
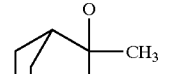

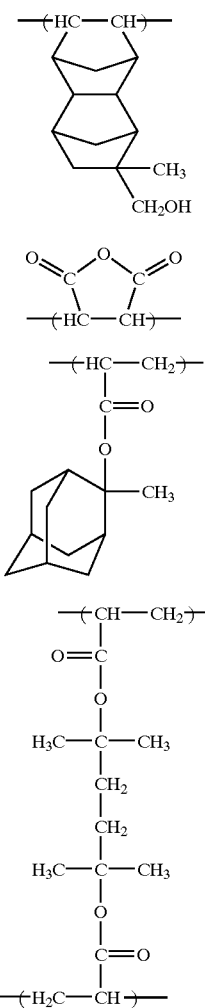

(7-4)
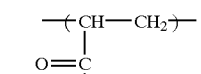
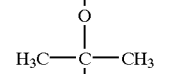
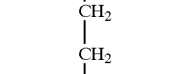
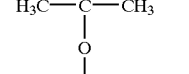
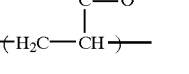

Synthesis Example 4

A white resin with Mw of 5,400 was obtained in the same manner as in the Synthesis Example 1 except for using 52.9 g of 8-hydroxytetracyclo[4.4.0.1$^{2,5}$.1$^{7,10}$]ododec-3-ene, 34.3 g of maleic anhydride, 58.8 g of an acrylic acid derivative (III-1) shown by the above formula (iii-51), 9.7 g of 5-t-butoxycarbonylbicyclo[2.2.1]hept-2-ene, 30 g of azobisisobutyronitrile, and 156 g of tetrahydrofuran as raw materials.

This resin was a copolymer of the recurring units (8-1), (8-2), (8-3), and (8-4) shown by the following formulas in the proportions of 30 mol %, 35 mol %, 30 mol %, and 5 mol %, respectively. This resin is referred to as a "resin (A1-4)".

(8-1)
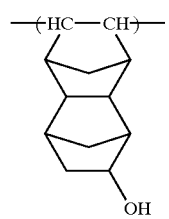

(8-2)
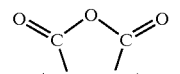

(8-3)
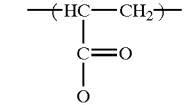

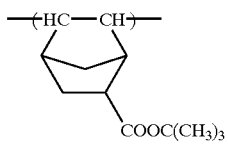

(8-4)
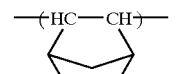

Synthesis Example 5

A white resin with Mw of 7,000 was obtained in the same manner as in the Synthesis Example 1 except for using 55.8 g of hymic anhydride, 33.3 g of maleic anhydride, 79.4 g of an acrylic acid derivative (III-1) shown by the above formula (iii-9), and 169 g of n-butyl acetate as raw materials.

This resin was a copolymer of the recurring units (9-1), (9-2), and (9-3) shown by the following formulas in the proportions of 34 mol %, 34 mol %, and 32 mol %, respectively. This resin is referred to as a "resin (A1-5)".

(9-1)
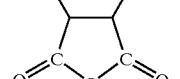

(9-2)
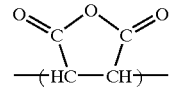

(9-3)
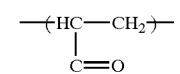

Synthesis Example 6

A white resin with Mw of 9,700 was obtained in the same manner as in the Synthesis Example 1 except for using 55.6 g of 8-cyanotetracyclo[4.4.0.1$^{2,5}$.1$^{7,10}$]dodec-3-ene, 29.4 g of maleic anhydride, 93.7 g of an acrylic acid derivative (III-1) shown by the above formula (iii-49), 15 g of azobisisobutyronitrile, and 179 g of n-butyl acetate as raw materials.

This resin was a copolymer of the recurring units (10-1), (10-2), and (10-3) shown by the following formulas in the proportions of 30 mol %, 30 mol %, and 40 mol %, respectively. This resin is referred to as a "resin (A1-6)".

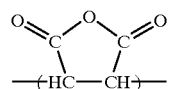
(10-1)

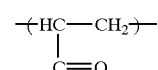
(10-2)

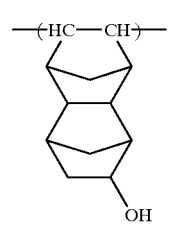
(10-3)

Synthesis Example 7

A white resin with Mw of 7,700 was obtained in the same manner as in the Synthesis Example 1 except for using 35.2 g of 8-hydroxytetracyclo[$4.4.0.1^{2,5}.1^{7,10}$]dodec-3-ene, 34.3 g of maleic anhydride, 70.2 g of a methacrylic acid derivative (III-1) shown by the above formula (iii-48), 14.1 g of bicyclo[2.2.1]hept-2-ene, 15 g of azobisisobutyronitrile, and 231 g of n-butyl acetate as raw materials.

This resin was a copolymer of the recurring units (11-1), (11-2), (11-3), and (11-4) shown by the following formulas in the proportions of 20 mol %, 35 mol %, 30 mol %, and 15 mol %, respectively. This resin is referred to as a "resin (A1-7)".

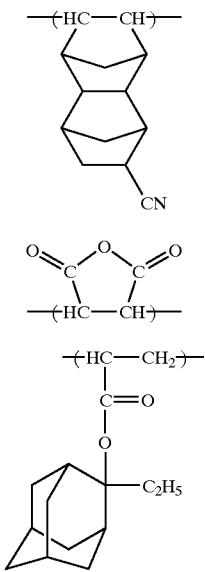
(11-1)

(11-2)

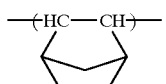
(11-3)

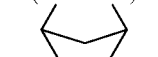
(11-4)

Synthesis Example 8

A white resin with Mw of 8,000 was obtained in the same manner as in the Synthesis Example 1 except for using 55.9 g of 8-(1'-ethoxyethoxy)tetracyclo[$4.4.0.1^{2,5}.1^{7,10}$]dodec-3-ene, 31.9 g of maleic anhydride, 82.0 g of a methacrylic acid derivative (III-1) shown by the above formula (iii-48), 9.4 g of bicyclo[2.2.1]hept-2-ene, 15 g of azobisisobutyronitrile, and 269 g of n-butyl acetate as raw materials.

This resin was a copolymer of the recurring units (12-1), (12-2), (12-3), and (12-4) shown by the following formulas in the proportions of 22.5 mol %, 32.5 mol %, 35 mol %, and 10 mol %, respectively. This resin is referred to as a "resin (A1-8)".

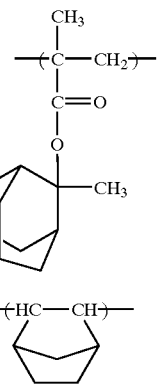
(12-1)

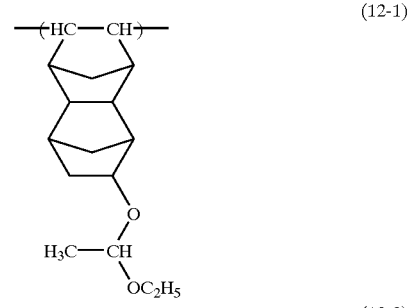
(12-2)

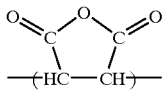
(12-3)

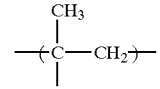
(12-4)

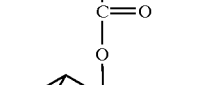

Synthesis Example 9

A white resin with Mw of 9,200 was obtained in the same manner as in the Synthesis Example 1 except for using 62.0 g of 8-(1'-ethoxyethoxy) tetracyclo [4.4.0.1$^{2,5}$.1$^{7,10}$]dodec-3-ene, 29.4 g of maleic anhydride, 88.0 g of an acrylic acid derivative (III-1) shown by the above formula (iii-47), 9.7 g of 8-n-butoxycarbonyltetracyclo[4.4.0.1$^{2,5}$.1$^{7,10}$]dodec-3-ene, 15 g of azobisisobutyronitrile, and 284 g of n-butyl acetate as raw materials.

This resin was a copolymer of the recurring units (13-1), (13-2), (13-3), and (13-4) shown by the following formulas in the proportions of 25 mol %, 30 mol %, 40 mol %, and 5 mol %, respectively. This resin is referred to as a "resin (A1-9)".

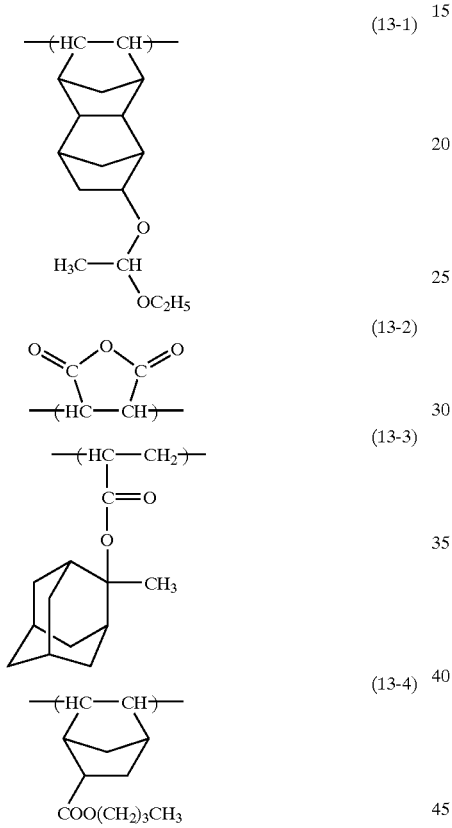

Synthesis Example 10

A white resin with Mw of 7,900 was obtained in the same manner as in the Synthesis Example 1 except for using 35.2 g of 8-hydroxytetracyclo[4.4.0.1$^{2,5}$.1$^{7,10}$]dodec-3-ene, 34.3 g of maleic anhydride, 70.2 g of a methacrylic acid derivative (III-1) shown by the above formula (iii-36), 14.1 g of bicyclo[2.2.1]hept-2-ene, 15 g of azobisisobutyronitrile, and 231 g of n-butyl acetate as raw materials.

This resin was a copolymer of the recurring units (14-1), (14-2), (14-3), and (14-4) shown by the following formulas in the proportions of 20 mol %, 35 mol %, 30 mol %, and 15 mol %, respectively. This resin is referred to as a "resin (A1-10)".

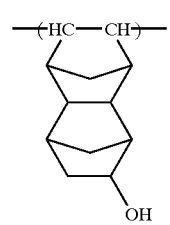
(14-1)

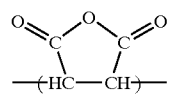
(14-2)

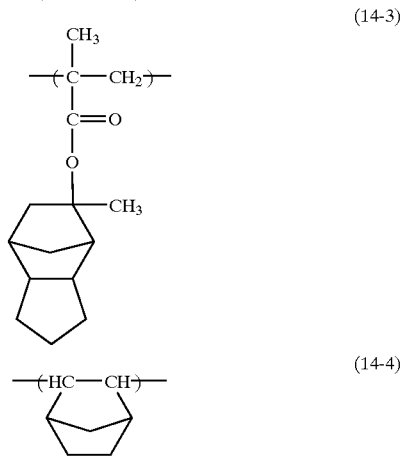
(14-3)

(14-4)

Synthesis Example 11

A white resin with Mw of 8,300 was obtained in the same manner as in the Synthesis Example 1 except for using 35.2 g of 8-hydroxytetracyclo[4.4.0.1$^{2,5}$.1$^{7,10}$]dodec-3-ene, 34.3 g of maleic anhydride, 70.2 g of a methacrylic acid derivative (III-1) shown by the above formula (iii-44), 14.1 g of bicyclo[2.2.1]hept-2-ene, 15 g of azobisisobutyronitrile, and 231 g of n-butyl acetate as raw materials.

This resin was a copolymer of the recurring units (15-1), (15-2), (15-3), and (15-4) shown by the following formulas in the proportions of 20 mol %, 35 mol %, 30 mol %, and 15 mol %, respectively. This resin is referred to as a "resin (A1-11)".

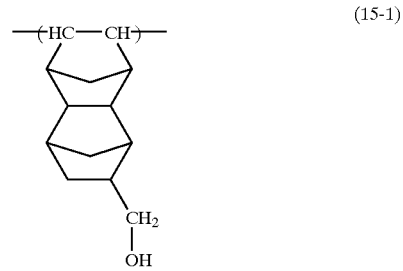
(15-1)

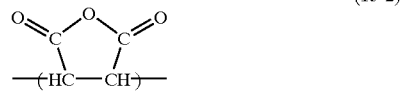
(15-2)

-continued (15-3)

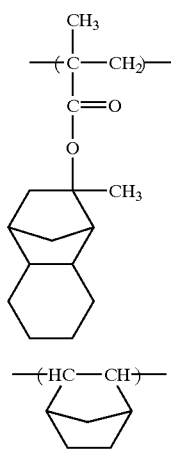

(15-4)

Synthesis Example 12

A white resin with Mw of 8,300 was obtained in the same manner as in the Synthesis Example 1 except for using 35.2 g of 8-hydroxytetracyclo[$4.4.0.1^{2,5}.1^{7,10}$]dodec-3-ene, 34.3 g of maleic anhydride, 70.2 g of an acrylic acid derivative (III-1) shown by the above formula (iii-47), 14.1 g of bicyclo[2.2.1]hept-2-ene, 15 g of azobisisobutyronitrile, and 231 g of n-butyl acetate as raw materials.

This resin was a copolymer of the recurring units (16-1), (16-2), (16-3), and (16-4) shown by the following formulas in the proportions of 20 mol %, 35 mol %, 30 mol %, and 15 mol %, respectively. This resin is referred to as a "resin (A1-12)".

(16-1)

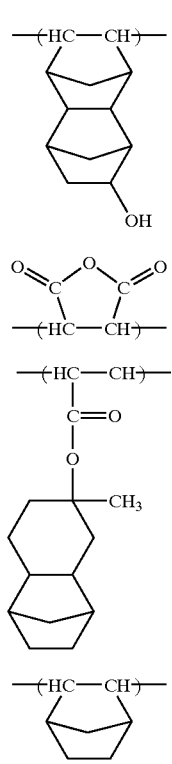

(16-2)

(16-3)

(16-4)

Synthesis Example 13

A white resin with Mw of 8,300 was obtained in the same manner as in the Synthesis Example 1 except for using 62.1 g of 8-hydroxytetracyclo[$4.4.0.1^{2,5}.1^{7,10}$]dodec-3-ene, 34.5 g of maleic anhydride, 103.4 g of a methacrylic acid derivative (III-1) shown by the above formula (iii-55), 21.6 g of 2,2'-dimethylazobis(2-methylpropionate), and 200 g of tetrahydrofuran as raw materials.

This resin was a copolymer of the recurring units (17-1), (17-2), and (17-3) shown by the following formulas in the proportions of 30mol %, 30mol %, and 40mol %, respectively. This resin is referred to as a "resin (A1-13)".

(17-1)

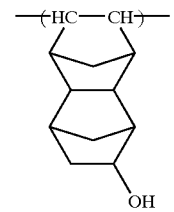

(17-2)

(17-3)

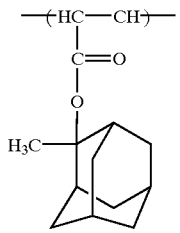

Synthesis Example 14

A white resin with Mw of 8,500 was obtained in the same manner as in the Synthesis Example 1 except for using 59.3 g of 8-methyl-8-hydroxytetracyclo[$4.4.0.1^{2,5}.1^{7,10}$]dodec-3-ene, 28.5 g of maleic anhydride, 123.7 g of a methacrylic acid derivative (III-2) shown by the following formula (iii-a), 15 g of azobisisobutyronitrile, and 212 g of n-butyl acetate as raw materials.

This resin was a copolymer of the recurring units (18-1), (18-2), and (18-3) shown by the following formulas in the proportions of 29mol %, 29mol %, and 42 mol %, respectively. This resin is referred to as a "resin (A2-1)".

(iii-a)

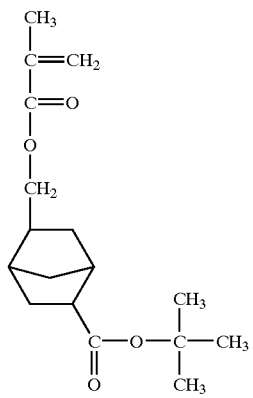

(18-1)

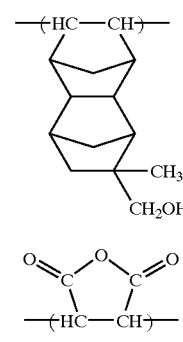

(18-2)

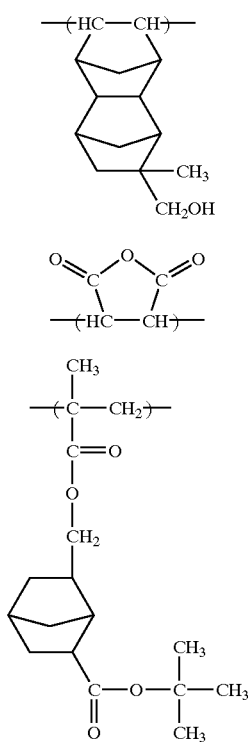

(18-3)

Synthesis Example 15

A white resin with Mw of 8,200 was obtained in the same manner as in the Synthesis Example 1 except for using 15.5 g of 5-t-butoxycarbonylbicyclo[2.2.1]hept-2-ene, 47.6 g of 8-hydroxytetracyclo[4.4.0.1$^{2,5}$.1$^{7,10}$]dodec-3-ene, 34.3 g of maleic anhydride, 91.9 g of a methacrylic acid derivative (III-2) shown by the following formula (iii-b), 15 g of azobisisobutyronitrile, and 189 g of n-butyl acetate as raw materials.

This resin was a copolymer of the recurring units (19-1), (19-2), (19-3), and (19-4) shown by the following formulas in the proportions of 8 mol %, 27 mol %, 35 mol %, and 30 mol %, respectively. This resin is referred to as a "resin (A2-2)".

(iii-b)

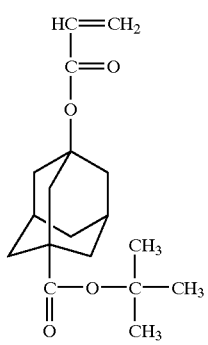

-continued (19-1)

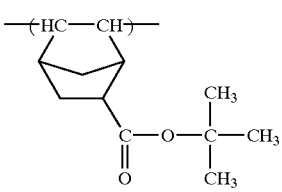

(19-2)

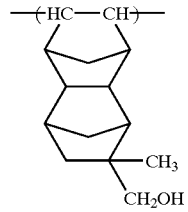

(19-3)

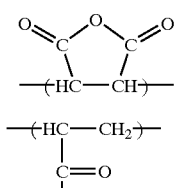

(19-4)

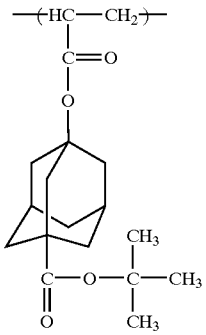

Examples 1–20 and Comparative Example 1

Each composition solution containing the components shown in Table 1 was evaluated. The evaluation results are shown in Tables 3 and 4.

Components other than the resins (A1-l) to (A1-16), (A2-1), and (A2-2) shown in Tables 1 are as follows.

Other Resins a-1: t-Butylmethacrylate/methylmethacrylate/methacrylic acid copolymer (copolymerization molar ratio=40/40/20, Mw=20,000)

Acid Generator (B)

B-1: Triphenylsulfonium trifluoromethanesulfonate
B-2: Triphenylsulfonium nonafluoro-n-butanesulfonate
B-3: 4-n-Butoxy-1-naphthyltetrahydrothiophenium nonafluoro-n-butanesulfonate
B-4: Bis(4-t-butylphenyl)iodonium nonafluoro-n-butanesulfonate
B-5: Trifluoromethanesulfonylbicyclo[2.2.1]hept-5-ene-2,3-dicarbodiimide
B-6: 1-(3,5-dimethyl-4-hydroxyphenyl) tetrahydrothiophenyl nonafluoro-n-butanesulfonate Acid Diffusion Controller C-1: Tri-n-octylamine
C-2: Methyldicyclohexylamine
C-3: 1-(2'-hydroxyethyl)piperazine
C-4: 4-Hydroxyquinoline
C-5: N-t-butoxycarbonyldicyclohexylamine
C-6: N-t-butoxycarbonyl-2-phenylbenzimidazole
C-7: Bis(2-dimethylaminoethyl)ether Other Additives
D-1: t-Butyl deoxycholate (see the following formula (20))

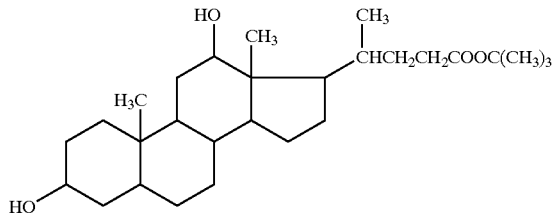
(20)

D-2: Di-t-butyl 1,3-adamantanedicarboxylate
D-3: t-Butoxycarbonylmethyl deoxycholate Solvent E-1: 2-Heptanone
E-2: Ethyl 2-hydroxypropionate
E-3: Propylene glycol monoethyl ether acetate
E-4: Ethyl 4-ethoxypropionate
E-5: Cyclohexanone

TABLE 1

| | Resin (part(s)) | Acid generator (B) (part(s)) | Acid diffusion controller (part(s)) | Other additives (part(s)) | Solvent (part(s)) |
|---|---|---|---|---|---|
| Example 1 | A1-1(100) | B-1(1.5) | C-1(0.03) | — | E-1(530) |
| Example 2 | A1-1(90) | B-2(1.5) | C-2(0.03) | D-1(10) | E-2(430) E-3(100) |
| Example 3 | A1-2(100) | B-1(1.5) | C-3(0.03) | — | E-2(530) |
| Example 4 | A1-2(90) | B-3(2.0) | C-1(0.03) | D-1(10) | E-4(530) |
| Example 5 | A1-3(90 | B-1(1.5) B-4(0.3) | C-1(0.03) | D-1(10) | E-1(530) |
| Example 6 | A1-4(90) | B-2(1.5) B-5(0.3) | C-4(0.03) | D-1(10) | E-3(530) |
| Example 7 | A1-5(90) | B-2(1.5) | C-4(0.03) | D-1(10) | E-2(530) |
| Example 8 | A1-6(92) | B-2(1.5) | C-2(0.03) | D-1(8) | E-2(430) E-3(100) |
| Example 9 | A1-7(90) | B-2(1.6) | C-2(0.03) | D-1(10) | E-2(430) E-3(100) |
| Example 10 | A1-8(85) | B-2(1.5) | C-2(0.03) | D-1(15) | E-2(430) E-3(100) |
| Example 11 | A1-9(90) | B-2(1.5) | C-2(0.03) | D-1(10) | E-2(430) E-3(100) |
| Example 12 | A1-10(90) | B-2(1.5) | C-3(0.03) | D-1(10) | E-1(530) |
| Example 13 | A1-11(90) | B-2(1.5) | C-2(0.03) | D-1(10) | E-1(530) |
| Example 14 | A1-12(90) | B-2(1.5) | C-3(0.03) | D-1(10) | E-1(530) |
| Example 15 | A1-8(85) | B-2(2.0) | C-3(0.03) | D-3(15) | E-1(430) E-2(100) |
| Example 16 | A1-8(88) | B-3(3.0) | C-5(0.09) | D-3(12) | E-1(530) |
| Example 17 | A1-9(88) | B-3(3.0) | C-5(0.06) C-6(0.03) | D-3(12) | E-1(430) E-2(100) |
| Example 18 | A1-13(85) | B-6(3.0) | C-5(0.09) | D-3(15) | E-1(530) |
| Example 19 | A2-1(90) | B-2(1.5) | C-1(0.03) | D-2(10) | E-1(530) |
| Example 20 | A2-2(90) | B-4(1.5) | C-7(0.03) | D-2(10) | E-1(430) E-4(100) |
| Comparative Example 1 | A1-1(90) | B-1(1.5) | C-1(0.03) | D-1(10) | E-1(530) |

TABLE 2

| | Thickness of resist film (μm) | Substrate | PB Temperature (° C.) | PB Time (sec) | PEB Temperature (° C.) | PEB Time (sec) |
|---|---|---|---|---|---|---|
| Example 1 | 0.4 | ARC | 130 | 90 | 140 | 90 |
| Example 2 | 0.4 | ARC | 130 | 90 | 140 | 90 |
| Example 3 | 0.4 | SiON | 130 | 90 | 130 | 90 |
| Example 4 | 0.2 | ARC | 120 | 90 | 130 | 90 |
| Example 5 | 0.2 | ARC | 120 | 90 | 130 | 90 |
| Example 6 | 0.4 | ARC | 140 | 90 | 140 | 90 |
| Example 7 | 0.4 | ARC | 120 | 90 | 130 | 90 |
| Example 8 | 0.4 | SiON | 130 | 90 | 140 | 90 |
| Example 9 | 0.4 | ARC | 130 | 90 | 140 | 90 |
| Example 10 | 0.4 | ARC | 130 | 90 | 140 | 90 |
| Example 11 | 0.4 | ARC | 130 | 90 | 140 | 90 |
| Example 12 | 0.4 | ARC | 130 | 90 | 130 | 90 |
| Example 13 | 0.4 | ARC | 130 | 90 | 140 | 90 |

TABLE 2-continued

| | Thickness of resist film (μm) | Substrate | PB Temperature (° C.) | PB Time (sec) | PEB Temperature (° C.) | PEB Time (sec) |
|---|---|---|---|---|---|---|
| Example 14 | 0.4 | ARC | 130 | 90 | 130 | 90 |
| Example 15 | 0.4 | ARC | 130 | 90 | 130 | 90 |
| Example 16 | 0.4 | ARC | 130 | 90 | 130 | 90 |
| Example 17 | 0.4 | ARC | 130 | 90 | 130 | 90 |
| Example 18 | 0.4 | ARC | 130 | 90 | 130 | 90 |
| Example 19 | 0.4 | ARC | 130 | 90 | 140 | 90 |
| Example 20 | 0.4 | ARC | 130 | 90 | 140 | 90 |
| Comparative Example 1 | 0.4 | ARC | 130 | 90 | 130 | 90 |

TABLE 3

| | Radiation transmittance (193 nm %) | Relative etching rate Etching gas CF₄ | Cl₂ | Ar | Sensitivity (J/m²) | Resolution (μm) | Pattern shape |
|---|---|---|---|---|---|---|---|
| Example 1 | 66 | 1.1 | 1.1 | 1.1 | 110 | 0.15 | Good |
| Example 2 | 68 | 1.1 | 1.1 | 1.2 | 120 | 0.15 | Good |
| Example 3 | 63 | 1.3 | 1.3 | 1.3 | 90 | 0.15 | Good |
| Example 4 | 72 | 1.3 | 1.3 | 1.3 | 120 | 0.15 | Good |
| Example 5 | 66 | 1.1 | 1.1 | 1.2 | 110 | 0.15 | Good |
| Example 6 | 58 | 1.3 | 1.4 | 1.3 | 90 | 0.15 | Good |
| Example 7 | 58 | 1.3 | 1.3 | 1.3 | 100 | 0.15 | Good |
| Example 8 | 66 | 1.1 | 1.1 | 1.2 | 120 | 0.15 | Good |
| Example 9 | 68 | 1.2 | 1.1 | 1.2 | 130 | 0.15 | Good |
| Example 10 | 70 | 1.1 | 1.1 | 1.2 | 120 | 0.15 | Good |
| Example 11 | 71 | 1.1 | 1.2 | 1.2 | 130 | 0.15 | Good |
| Example 12 | 70 | 1.1 | 1.1 | 1.1 | 120 | 0.15 | Good |
| Example 13 | 71 | 1.1 | 1.2 | 1.1 | 130 | 0.15 | Good |
| Example 14 | 69 | 1.2 | 1.2 | 1.2 | 110 | 0.15 | Good |
| Example 15 | 68 | 1.4 | 1.1 | 1.2 | 120 | 0.15 | Good |
| Example 16 | 70 | 1.1 | 1.0 | 1.1 | 90 | 0.15 | Good |
| Example 17 | 70 | 1.1 | 1.1 | 1.2 | 100 | 0.15 | Good |
| Example 18 | 69 | 1.1 | 1.1 | 1.1 | 90 | 0.15 | Good |
| Comparative Example 1 | 62 | 2.5 | 2.1 | 2.7 | 140 | 0.18 | Good |

TABLE 4

| | Radiation transmittance (193 nm %) | Relative etching rate | Sensitivity (J/m²) | Resolution (μm) | Defective development | Pattern shape |
|---|---|---|---|---|---|---|
| Example 19 | 66 | 1.3 | 50 | 0.16 | 0 | Good |
| Example 20 | 63 | 1.3 | 54 | 0.16 | 0 | Good |

The radiation-sensitive resin composition of the present invention is suitable for use as a chemically-amplified resist showing sensitivity to active radiation such as deep ultraviolet rays represented by a KrF excimer laser or ArF excimer laser, particularly exhibiting superior dry etching resistance without being affected by types of etching gas, having high radiation transmittance, exhibiting excellent basic characteristics as a resist such as sensitivity, resolution, and pattern shape, possessing excellent storage stability as a composition, and exhibiting sufficient adhesion to substrates. The radiation-sensitive resin composition is suitably used in fabrication of semiconductor devices which will become more and more minute.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:

(A) a resin containing an acid-dissociable group which is insoluble or scarcely soluble in alkali and becomes alkali soluble when the acid-dissociable group dissociates, comprising the following recurring unit (I), recurring unit (II), and at least one of the recurring units (III-1) and (III-2);

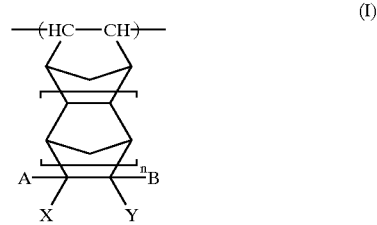

(I)

wherein A and B independently represent a hydrogen atom or a linear or branched alkyl group having 1–4 carbon atoms; X and Y independently represent a hydrogen atom, a monovalent oxygen-containing polar group, or a monovalent nitrogen-containing polar group, provided that at least one of X and Y represents a monovalent oxygen-containing polar group or a monovalent nitrogen-containing polar group, otherwise X and Y form a dicarboxylic anhydride group in combination; and n is an integer from 0 to 2;

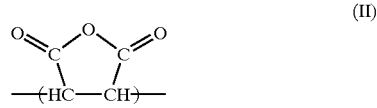

(II)

-continued

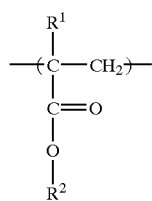
(III-1)

wherein R¹ represents a hydrogen atom or a methyl group; and R² represents a group shown by the following formula (a);

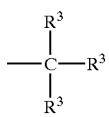
(a)

wherein R³s individually represent a monovalent alicyclic hydrocarbon group having 4–20 carbon atoms, a derivative thereof, or a linear or branched alkyl group having 1–4 carbon atoms, provided that at least one of R³s is a monovalent alicyclic hydrocarbon group having 4–20 carbon atoms or a derivative thereof, or two of R³s form a divalent alicyclic hydrocarbon group having 4–20 carbon atoms or a derivative thereof in combination together with the carbon atom to which the two R³s bond, with the remaining R³ being a linear or branched alkyl group having 1–4 carbon atoms or a monovalent alicyclic hydrocarbon group having 4–20 carbon atoms or a derivative thereof;

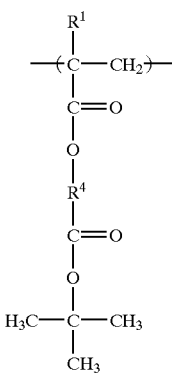
(III-2)

wherein R¹ is the same as defined above and R⁴ represents a divalent hydrocarbon group having an alicyclic skeleton containing 3–15 carbon atoms; and (B) a photoacid generator.

2. The radiation-sensitive resin composition according to claim 1, wherein the monovalent alicyclic hydrocarbon group having 4–20 carbon atoms for R³ and the divalent alicyclic hydrocarbon group having 4–20 carbon atoms formed by two R³ s in the group R² in the recurring unit (III-1) are alicyclic hydrocarbon groups derived from norbornane, tricyclodecane, tetracyclododecane, or adamantane, either substituted or unsubstituted by a linear, branched, or cyclic alkyl group having 1–8 carbon atoms.

3. The radiation-sensitive resin composition according to claim 1, wherein the divalent hydrocarbon group having an alicyclic skeleton containing 3–15 carbon atoms for R⁴ in the recurring unit (III-2) is an alicyclic hydrocarbon group derived from norbornane, tricyclodecane, tetracyclododecane, or adamantane, either substituted or unsubstituted by a linear, branched, or cyclic alkyl group having 2–8 carbon atoms.

4. The radiation-sensitive resin composition according to claim 1, wherein the content of the recurring unit (I), recurring unit (II), and at least one of recurring unit (III-1) and recurring unit (III-2) is respectively 20–70mol %, 5–70mol %, and 5–70 mol % of the total amount of the recurring units.

5. The radiation-sensitive resin composition according to claim 1, comprising the photoacid generator (B) in an amount of 0.1–10 parts by weight for 100 parts by weight of the resin (A).

6. The radiation-sensitive resin composition according to claim 1, further comprising a nitrogen-containing compound shown by the following formula (21) as an acid diffusion controller:

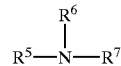
(21)

wherein R⁵, R⁶, and R⁷ individually represent a hydrogen atom, a substituted or unsubstituted alkyl group, substituted or unsubstituted aryl group, or substituted or unsubstituted aralkyl group.

7. The radiation-sensitive resin composition according to claim 1, further comprising an alicyclic additive having an acid-dissociable organic group which is selected from the group consisting of adamantane derivatives, deoxycholates, and lithocholates.

8. The radiation-sensitive resin composition according to claim 1, wherein the monovalent oxygen-containing polar group representing the group X or Y in the recurring unit (I) is selected from the group consisting of:

(i) a hydroxyl group;
(ii) a linear, branched, or cyclic hydroxyalkyl group having 1–8 carbon atoms;
(iii) a linear, branched, or cyclic alkoxyl group having 1–8 carbon atoms;
(iv) a linear, branched, or cyclic alkoxyalkyl group having 2–10 carbon atoms;
(v) a linear, branched, or cyclic alkoxyalkoxyl group having 2–10 carbon atoms;
(vi) a linear or branched alkoxycarbonyloxy group having 2–9 carbon atoms;
(vii) a linear, branched, or cyclic (1-alkoxyalkoxy)alkyl group having 3–11 carbon atoms, and
(viii) a linear or branched alkoxycarbonyloxyalkyl group having 3–10 carbon atoms.

9. The radiation-sensitive resin composition according to claim 1, wherein the monovalent oxygen-containing polar group representing the group X or Y in the recurring unit (I) is selected from the group consisting of a hydroxyl group, a linear, branched, or cyclic hydroxyalkyl group having 1–8 carbon atoms, and a linear, branched, or cyclic alkoxyalkoxyl group having 2–10 carbon atoms.

10. The radiation-sensitive resin composition according to claim 1, wherein the monovalent oxygen-containing polar group representing the group X or Y in the recurring unit (I) is selected from the group consisting of a hydroxyl group, a hydroxymethyl group, and ethoxyethoxy group.

11. A radiation-sensitive resin composition comprising:
(A) a resin containing an acid-dissociable group which is insoluble or scarcely soluble in alkali and becomes alkali soluble when the acid-dissociable group dissociates, comprising the following recurring unit (I-1), recurring unit (I-2), recurring unit (II), and at least one of the recurring units (III-1) and (III-2);

(I-1)

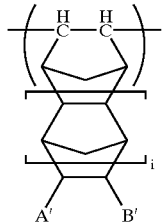

wherein A' and B' independently represent a hydrogen atom, a linear or branched alkyl group having 1–4 carbon atoms, or an acid-dissociable group having 20 or less carbon atoms which dissociates an acidic functional group in the presence of an acid, provided that at least one of A' and B' represents the acid-dissociable group, and i is an integer from 0 to 2;

(I-2)

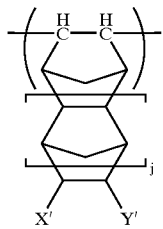

wherein X' and Y' independently represent a hydrogen atom, a linear or branched alkyl group having 1–4 carbon atoms, or a monovalent oxygen-containing polar group or a monovalent nitrogen-containing polar group, provided that at least one of X' and Y' represents the monovalent oxygen-containing polar group or monovalent nitrogen-containing polar group, and j is an integer from 0 to 2;

(II)

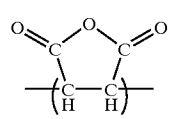

(III-1)

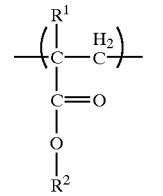

wherein $R^1$ represents a hydrogen atom or a methyl group; and $R^2$ represents the group shown by the following formula (a);

(a)

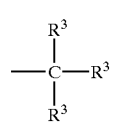

wherein $R^3$s individually represent a monovalent-alicyclic hydrocarbon group having 4–20 carbon atoms, a derivative thereof, or a linear or branched alkyl group having 1–4 carbon atoms, provided that at least one of $R^3$s is a monovalent alicyclic hydrocarbon group having 4–20 carbon atoms or a derivative thereof, or two of $R^3$s form a divalent alicyclic hydrocarbon group having 4–20 carbon atoms or a derivative thereof in combination together with the carbon atom to which the two $R^3$s bond, with the remaining $R^3$ being a linear or branched alkyl group having 1–4 carbon atoms or a monovalent alicyclit hydrocarbon group having 4–20 carbon atoms or a derivative thereof;

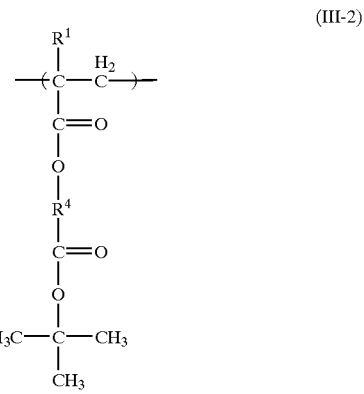

(III-2)

wherein $R^1$ is the same as defined above and $R^4$ represents a divalent hydrocarbon group having an alicyclic skeleton containing 3–15 carbon atoms; and (B) a photoacid generator.

12. The radiation-sensitive resin composition according to claim 11, wherein A' and B' in the formula (I-1) represent acid-dissociable groups having 20 or less carbon atoms which dissociate in the presence of an acid to produce a carboxyl group.

13. The radiation-sensitive resin composition according to claim 11, wherein the monovalent alicyclic hydrocarbon group having 4–20 carbon atoms for $R^3$ and the divalent alicyclic hydrocarbon group having 4–20 carbon atoms formed by two $R^3$s in the group $R^2$ in the recurring unit (III-1) are alicyclic hydrocarbon groups derived from norbornane, tricyclodecane, tetracyclododecane, or adamantane, either substituted or unsubstituted by a linear, branched, or cyclic alkyl group having 1–8 carbon atoms.

14. The radiation-sensitive resin composition according to claim 11, wherein the divalent hydrocarbon group having an alicyclic skeleton containing 3–15 carbon atoms for $R^4$ in the recurring unit (III-2) is an alicyclic hydrocarbon group derived from norbornane, tricyclodecane, tetracyclododecane, or adamantane, either substituted or unsubstituted by a linear, branched, or cyclic alkyl group having 2–8 carbon atoms.

15. The radiation-sensitive resin composition according to claim 11, wherein the content of the recurring unit (I-1), recurring unit (I-2), recurring unit (II), and at least one of recurring unit (III-1) and recurring unit (III-2) is respectively 10–60 mol %, 10–60 mol %, 10–50 mol %, and 10–50 mol % of the total amount of the recurring units.

16. The radiation-sensitive resin composition according to claim 11, comprising the photoacid generator (B) in an amount of 0.1–10 parts by weight for 100 parts by weight of the resin (A).

17. The radiation-sensitive resin composition according to claim 11, further comprising a nitrogen-containing compound shown by the following formula (21) as an acid diffusion controller:

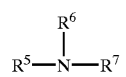

(21)

wherein $R^5$, $R^6$, and $R^7$ individually represent a hydrogen atom, a substituted or unsubstituted alkyl group, substituted or unsubstituted aryl group, or substituted or unsubstituted aralkyl group.

18. The radiation-sensitive resin composition according to claim 11, further comprising an alicyclic additive having an acid-dissociable organic group which is selected from the group consisting of adamantane derivatives, deoxycholates, and lithocholates.

* * * * *